(12) United States Patent
Okuyama et al.

(10) Patent No.: US 9,676,171 B2
(45) Date of Patent: Jun. 13, 2017

(54) GAS BARRIER LAMINATE HAVING EXCELLENT WATER BARRIER PROPERTY

(71) Applicant: TOYO SEIKAN GROUP HOLDINGS, LTD., Tokyo (JP)

(72) Inventors: Shimpei Okuyama, Kanagawa (JP); Yusuke Obu, Kanagawa (JP); Shunya Nangou, Kanagawa (JP); Kota Mori, Kanagawa (JP)

(73) Assignee: TOYO SEIKAN GROUP HOLDINGS, LTD., Tokyo (JP)

( * ) Notice: Subject to any disclaimer, the term of this patent is extended or adjusted under 35 U.S.C. 154(b) by 0 days.

(21) Appl. No.: 14/765,151

(22) PCT Filed: Feb. 6, 2014

(86) PCT No.: PCT/JP2014/052788
§ 371 (c)(1),
(2) Date: Jul. 31, 2015

(87) PCT Pub. No.: WO2014/123197
PCT Pub. Date: Aug. 14, 2014

(65) Prior Publication Data
US 2015/0368498 A1 Dec. 24, 2015

(30) Foreign Application Priority Data

Feb. 7, 2013 (JP) .................................. 2013-022253
Feb. 7, 2013 (JP) .................................. 2013-022656

(51) Int. Cl.
| | |
|---|---|
| B32B 27/30 | (2006.01) |
| B32B 9/00 | (2006.01) |
| B32B 27/18 | (2006.01) |
| C09D 201/02 | (2006.01) |
| C09D 133/02 | (2006.01) |
| C23C 16/44 | (2006.01) |
| C08J 7/04 | (2006.01) |

(52) U.S. Cl.
CPC ............... *B32B 27/30* (2013.01); *B32B 9/00* (2013.01); *B32B 27/18* (2013.01); *C08J 7/045* (2013.01); *C09D 133/02* (2013.01); *C09D 201/02* (2013.01); *C23C 16/44* (2013.01); *B32B 2307/7244* (2013.01); *C08J 2367/02* (2013.01); *C08J 2433/08* (2013.01); *C08J 2479/00* (2013.01); *C08J 2479/02* (2013.01); *Y10T 428/31663* (2015.04)

(58) Field of Classification Search
CPC .... B32B 2307/7742; B32B 2307/7744; B32B 2307/7746
See application file for complete search history.

(56) References Cited

U.S. PATENT DOCUMENTS

| | | | | |
|---|---|---|---|---|
| 5,153,038 | A * | 10/1992 | Koyama ................. | B32B 27/18 252/188.28 |
| 2003/0194517 | A1* | 10/2003 | Shi ....................... | B65D 1/0215 428/35.7 |
| 2009/0214854 | A1* | 8/2009 | Okawara ................... | C08J 5/18 428/323 |
| 2010/0089636 | A1 | 4/2010 | Ramadas et al. | |
| 2011/0180755 | A1* | 7/2011 | Adachi ...................... | C08F 8/32 252/194 |
| 2013/0071672 | A1* | 3/2013 | Li ........................... | B32B 27/08 428/447 |
| 2015/0243928 | A1* | 8/2015 | Grunlan ................... | C08J 7/045 428/216 |

FOREIGN PATENT DOCUMENTS

| | | |
|---|---|---|
| CN | 102166511 | 8/2011 |
| EP | 0 449 267 | 10/1991 |
| JP | 04-339810 | 11/1992 |
| JP | 06-190961 | 7/1994 |
| JP | 2000-255579 | 9/2000 |
| JP | 2004-018536 | 1/2004 |
| JP | 2004-142799 | 5/2004 |
| JP | 2009-090633 | 4/2009 |
| JP | 2009-095989 | 5/2009 |
| JP | 2010-511267 | 4/2010 |
| JP | 2011-131395 | 7/2011 |
| JP | 2012-025099 | 2/2012 |
| JP | 2012-061732 | 3/2012 |
| JP | 2012-228786 | 11/2012 |
| JP | 2013-000977 | 1/2013 |
| KR | 10-2002-0015287 | 2/2002 |

OTHER PUBLICATIONS

European Search Report issued in Patent Application No. 14748622.9, dated Jun. 21, 2016.
Chinese Office Action issued in Patent Application No. 201480018693.5, dated Jun. 2, 2016.
International Search Report issued in PCT/JP2014/052788, dated May 20, 2014.
Xu, Xiao Qiu et al., "Construction method and blending of water-absorbent resin"; Chemical Industry Press; Apr. 30, 2004; pp. 9-13.
Zheng , Jun Min, "Medicated polymer material science (3rd Edition)"; Chinese Medical Science and Technology Press; Jan. 31, 2009; pp. 184.

(Continued)

*Primary Examiner* — Marc Zimmer
(74) *Attorney, Agent, or Firm* — Greenblum & Bernstein, P.L.C.

(57) ABSTRACT

A gas barrier laminate 10 having an inorganic barrier layer 3 and a water-trapping layer 5 that are formed on a plastic base material 1, the water-trapping layer 5 including a matrix of a cationic polymer (a) in which is distributed a hygroscopic agent (b) having such a hygroscopic property as to attain a humidity lower than a humidity that can be attained by using the matrix. The gas barrier laminate exhibits super barrier property against water despite of a structure of a small number of layers.

18 Claims, 5 Drawing Sheets

(56) References Cited

OTHER PUBLICATIONS

Chinese Office Action issued in Counterpart Patent Appl. No. 201480018693.5, dated Jan. 24, 2017, along with an english translation thereof.
Korean Office Action issued in Counterpart Patent Appl. No. 10-2015-7023157, dated Oct. 18, 2016, along with an english translation thereof.

* cited by examiner

GAS BARRIER LAMINATE HAVING EXCELLENT WATER BARRIER PROPERTY

TECHNICAL FIELD

This invention relates to a gas barrier laminate having an inorganic barrier layer and a water-trapping layer (hygroscopic layer) formed on a plastic base material. More specifically, the invention relates to the above gas barrier laminate and to a coating composition used for forming the water-trapping layer in the laminate.

BACKGROUND ART

As means for improving properties and, specifically, gas barrier properties of various kinds of plastic base materials, there has been known an art of forming an inorganic barrier layer comprising a silicon oxide or the like by vacuum evaporation on the surface of the plastic base material (patent document 1).

In a variety of electronic devices that are developed and put to practical use in recent years, such as organic electroluminescent devices (organic EL devices), solar cells, touch panels, and e-papers, it is a requirement to avoid the leakage of the electric charge. Therefore, a high water barrier property has been desired for the plastic base materials that form circuit boards or for the plastic base materials such as films for sealing the circuit boards. The above-mentioned inorganic barrier layer, however, is not capable of meeting the requirement of water barrier property of such a high degree. Therefore, there have been made a variety of proposals in an effort to improve the water barrier property.

A patent document 2, for instance, is proposing a gas barrier laminate comprising a plastic base material, an inorganic barrier layer formed on the surface of the plastic base material, and, on the inorganic barrier layer, a sealing layer in which nano particles such as of a metal oxide and carbon nano tubes are dispersed as hygroscopic agents.

A patent document 3 proposes a gas barrier laminate (film) comprising an inorganic barrier layer, an organic layer and a water-trapping layer that are formed on a base film, the water-trapping layer being formed of a hygroscopic polymer (concretely, a polyamide) or being formed by dispersing a hygroscopic material such as silica gel or aluminum oxide in a high molecular binder such as electron ray-curable or ultraviolet ray-curable resin.

Further, a patent document 4 proposes a gas barrier laminate comprising a plastic base material, a gas barrier layer vapor-deposited on the surface of the plastic base material, and a hygroscopic layer formed thereon, the hygroscopic layer containing an alkylene oxide, acrylate nano particles or an organometal complex.

Even with the gas barrier laminates proposed in these patent documents 2 to 4, however, it is difficult to attain a high degree of water barrier property. For example, to attain such a super water barrier property that the water vapor permeability is not more than $10^{-6}$ g/m$^2$/day, it becomes necessary to employ a layer structure that includes many layers for adsorbing moisture (hygroscopic layers or sealing layers) requiring increased laborious work for forming the multilayer structure and, therefore, causing a decrease in the productivity. Therefore, it has been desired to further improve the water barrier property. Upon absorbing water, further, the layer for adsorbing moisture (hygroscopic layer or sealing layer) swells and lacks dimensional stability.

PRIOR ART DOCUMENTS

Patent Documents

Patent document 1: JP-A-2000-255579
Patent document 2: JP-A-2010-511267
Patent document 3: JP-A-2009-90633
Patent document 4: JP-A-2011-131395

OUTLINE OF THE INVENTION

Problems that the Invention is to Solve

It is, therefore, an object of the present invention to provide a gas barrier laminate that exhibits super barrier property against water despite of a structure of a small number of layers.

Another object of the present invention is to provide a gas barrier laminate that is effectively suppressed from swelling despite of absorbing moisture and still maintains excellent dimensional stability.

A further object of the present invention is to provide a coating composition that is favorably used for forming a water-trapping layer in the gas barrier laminate.

Means for Solving the Problems

According to the present invention, there is provided a gas barrier laminate having an inorganic barrier layer and a water-trapping layer that are formed on a plastic base material, the water-trapping layer including a matrix of an ionic polymer (a) in which is distributed a hygroscopic agent (b) having such a hygroscopic property as to attain a humidity lower than a humidity that can be attained by using the matrix.

In the gas barrier laminate of the present invention, it is desired that:
(1) The hygroscopic agent (b) is a crosslinked product of a monovalent metal salt of a poly(meth)acrylic acid;
(2) The inorganic barrier layer is an inorganic oxide film formed by the CVD method; and
(3) The water-trapping layer and the inorganic barrier layer are contiguous to each other.

Further, the gas barrier laminate of the present invention can use a cationic polymer (a1) or an anionic polymer (a2) as the ionic polymer (a).

It is desired that the following embodiments are employed by the gas barrier laminate of the present invention that uses the cationic polymer (a1) as the ionic polymer (a):
(4) A crosslinked structure is introduced into the matrix;
(5) The crosslinked structure includes a siloxane structure or an alicyclic structure; and
(6) The crosslinked structure is formed by being triggered by the reaction of the cationic group possessed by the cationic polymer (a1) with the epoxy group, and the siloxane structure is introduced by the reaction of a silane compound having the epoxy group, or the alicyclic structure is introduced from a compound having the epoxy group.

It is desired that the following embodiments are employed by the gas barrier laminate of the present invention that uses the anionic polymer (a2) as the ionic polymer (a):
(7) A crosslinked structure is introduced into the matrix of the anionic polymer (a2);
(8) The siloxane structure, too, is introduced into the matrix and, further, the alicyclic structure is included in the crosslinked structure;

(9) The crosslinked structure is introduced by the crosslinking reaction of the anionic group possessed by the anionic polymer (a2) with the epoxy group, and the siloxane structure is introduced by the reaction of the anionic polymer (a2) with the silane compound;
(10) The water-trapping layer is blended with a closely adhering agent (c) having a functional group that is reactive with the matrix in which the crosslinked structure is introduced and with the surface of the inorganic barrier layer, and the siloxane structure is introduced by the reaction of the closely adhering agent (c) with the matrix; and
(11) The closely adhering agent (c) is a compound having an alicyclic epoxy group and an alkoxysilyl group.

According to the present invention, there is, further, provided a coating composition obtained by dissolving or dispersing, in a solvent, an ionic polymer (a), a hygroscopic agent (b) having such a hygroscopic property as to attain a humidity lower than a humidity that can be attained by using the ionic polymer (a), and a crosslinking agent.

The coating composition of the present invention is preferably used for forming the water-trapping layer of the gas barrier laminate, and, for example, a crosslinked product of a monovalent metal salt of a poly(meth)acrylic acid is, preferably, used as the hygroscopic agent (b).

If the cationic polymer (a1) is used as the ionic polymer (a) in the coating composition, it is desired that:
(12) The hygroscopic agent (b) is contained in an amount of 50 to 1000 parts by weight and the crosslinking agent is contained in an amount of 5 to 60 parts by weight per 100 parts by weight of the cationic polymer (a1); and
(13) The crosslinking agent is a compound represented by the following formula (1):

wherein X is an organic group having an epoxy group at the terminal,
$R^1$ and $R^2$ are, respectively, methyl groups, ethyl groups or isopropyl groups, and
n is 0, 1 or 2.

Further, if the anionic polymer (a2) is used as the ionic polymer (a), it is desired that:
(14) The hygroscopic agent (b) is used in an amount of 50 to 1300 parts by weight, the crosslinking agent (c) is used in an amount of 1 to 50 parts by weight and the closely adhering agent is used in an amount of 0.1 to 10 parts by weight per 100 parts by weight of the anionic polymer (a2);
(15) The crosslinking agent is a diglycidyl ester represented by the following formula (2), $$G\text{-}O(C{=}O)\text{-}A\text{-}(C{=}O)O\text{-}G \quad (2)$$

wherein G is a glycidyl group, and
A is a divalent hydrocarbon group having an aliphatic ring; and
(16) The closely adhering agent is a silane compound represented by the following formula (1):

wherein X is an organic group having an epoxy group at the terminal,
$R^1$ and $R^2$ are, respectively, methyl groups, ethyl groups or isopropyl groups, and
n is 0, 1 or 2.

Effects of the Invention

The water-trapping layer formed in the gas barrier laminate of the present invention is capable of trapping water even in an atmosphere of a very low humidity and at a rate very higher than a rate of water permeation through the inorganic barrier layer. Besides, the water-trapping layer traps water over the whole layer without permitting it to leak to the outer side. Therefore, despite of forming only three layers, i.e., the plastic base material, inorganic barrier layer and water-trapping layer, the gas barrier laminate of the present invention can attain a very high degree of water barrier property or, in other words, can realize a water permeability of not more than $10^{-6}$ g/m²/day that is applicable enough to, for example, organic electroluminescent (organic EL) panels. Besides, the water trapped by the matrix is taken in by the hydroscopic agent (b), and the water-trapping layer is effectively suppressed from swelling despite it has adsorbed moisture. Therefore, dimensional stability can be maintained excellently.

As described above, the gas-barrier laminate of the present invention exhibits very high barrier property against water yet excelling in dimensional stability, and is useful as a base plate or a sealing layer for a variety of kinds of electronic devices.

Further, upon being applied and heated, the coating composition of the present invention easily forms the water-trapping layer on the gas barrier laminate. Specifically, by adding the crosslinking agent only, the crosslinked structure can be introduced into the matrix that forms the water-trapping layer making it possible to maintain excellently adhering property to the inorganic barrier layer, which is a great advantage of the present invention.

MODES FOR CARRYING OUT THE INVENTION

<Principle of the Invention>

Figure 1:
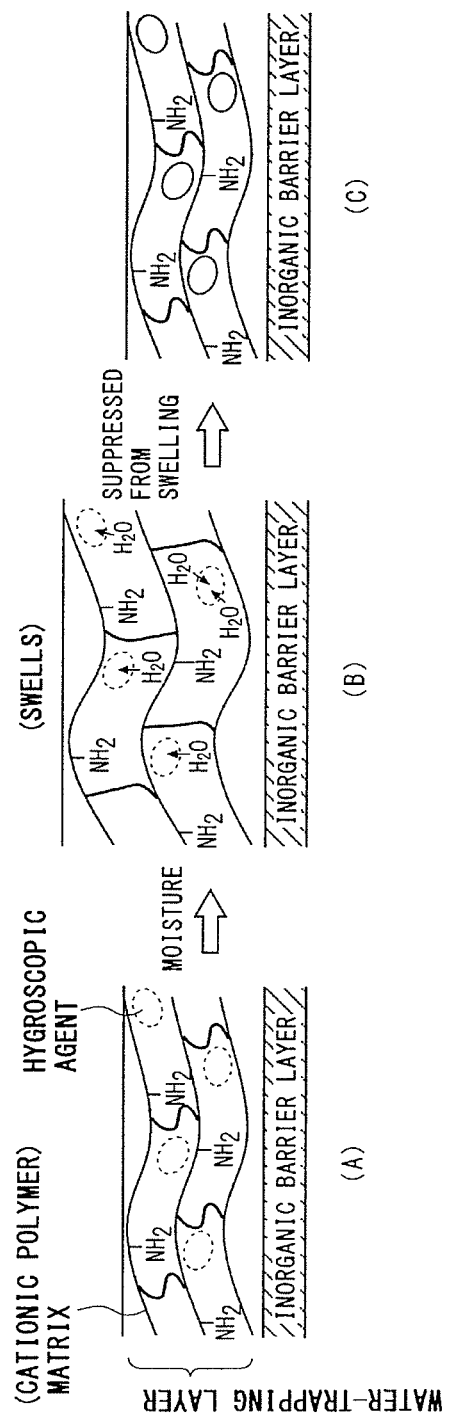
FIG. 1 is a view illustrating the principle of a gas barrier laminate of the present invention having a water-trapping layer formed by using a cationic polymer (a1).
Figure 2:
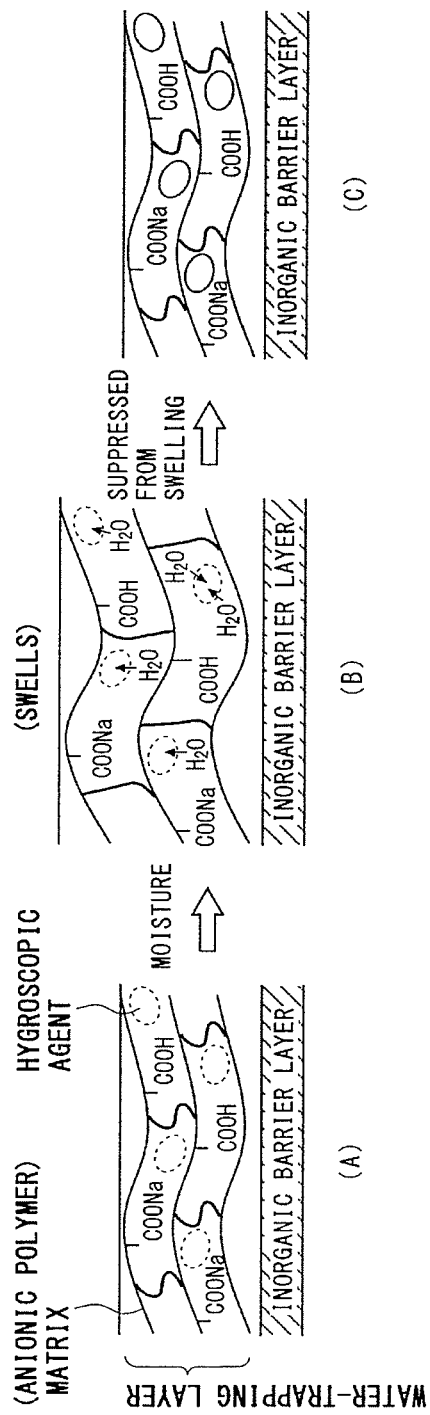
FIG. 2 is a view illustrating the principle of a gas barrier laminate of the present invention having a water-trapping layer formed by using an anionic polymer (a2).

Referring to FIGS. 1 and 2 illustrating the principle of trapping water in the water-trapping layer in the gas barrier laminate of the invention, the water-trapping layer has a matrix formed by using the ionic polymer (a) that much contains ionic groups ($NH_2$ groups in FIG. 1, or COONa groups and COOH groups in FIG. 2) which are hydrophilic. The matrix contains the hygroscopic agent (b) dispersed therein (see FIG. 1(A) and FIG. 2(A)).

In the laminate, a very small amount of water that has passed through the plastic base material (not shown in FIGS. 1 and 2) and the inorganic barrier layer is trapped by the water-trapping layer and is absorbed by the matrix (see FIGS. 1(B) and 2(B)). The matrix by itself exhibits a high degree of hygroscopic property and, therefore, traps and absorbs water without permitting it to leak.

Here, if the water is simply absorbed by the matrix, the absorbed water will be easily released due to a change in the environment such as rise in the temperature. Besides, the water that has infiltrated works to expand the gaps among the polymer molecules forming the matrix causing, therefore, the water-trapping layer to swell.

According to the present invention, however, the water absorbed in the matrix is, further, trapped by the hygroscopic agent having a stronger hygroscopic property (i.e., can attain a lower humidity) than that of the matrix (see FIGS. 1(C) and 2(C)). This effectively suppresses the swelling caused by the adsorbed water molecules. Besides, the water molecules are confined in the water-trapping layer. As a result, the water is effectively prevented from being released out of the water-trapping layer. As described above, the water-trapping layer has a high hygroscopic capability yet exhibiting two functions of trapping the water and confining the water. As will be described later, therefore, the water can be trapped even in an atmosphere of a very low humidity; i.e., the water is trapped at a rate very higher than the rate at which the water permeates through the inorganic barrier layer. Besides, the water is trapped by the layer as a whole and is not permitted to leak to the outer side. As a result, despite of forming only three layers, i.e., plastic base material, inorganic barrier layer and water-trapping layer, it is made possible to attain a water permeability of not more than $10^{-6}$ g/m$^2$/day that is applicable enough to, for example, organic electroluminescent (organic EL) panels.

Further, as will also be understood from FIGS. 1 and 2, if the crosslinked structure is introduced into the matrix, gaps among the molecules of the ionic polymer are suppressed from expanding despite water has infiltrated therein and it is made possible to more effectively suppress the swelling that is caused by the absorption of water.

Applied experiments appearing later demonstrate the fact that the water-trapping layer of the invention is capable of trapping water even in an atmosphere of a very low humidity and at a rate very higher than a rate at which the water permeates through the inorganic barrier layer.

<Layer Structure of the Gas Barrier Laminate>

Figure 3:
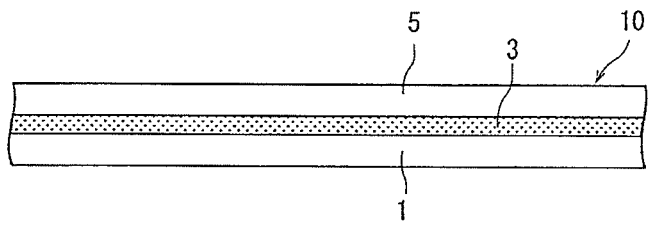
FIG. 3 is a sectional view schematically showing the structure of layers of the gas barrier laminate of the present invention.

Referring to FIG. 3 which is a sectional view schematically illustrating the gas barrier laminate of the present invention provided with the water-trapping layer mentioned above, the laminate generally designated at 10 comprises a plastic base material 1, an inorganic barrier layer 3 formed on the surface of the plastic base material 1, and a water-trapping layer 5 formed on the inorganic barrier layer 3.

<Plastic Base Material 1>

In the invention, the plastic base material 1 may be made of a thermoplastic or thermosetting resin that has been known per se.

Examples of the resin include, though not limited thereto only, polyolefins such as low-density polyethylene, high-density polyethylene, polypropylene, poly 1-butene, poly 4-methyl-1-pentene, or random or block copolymers of α-olefins like ethylene, propylene, 1-butene, or 4-methyl-1-pentene; cyclic olefin copolymers; ethylene.vinyl compound copolymers such as ethylene.vinyl acetate copolymer, ethylene.vinyl alcohol copolymer and ethylene.vinyl chloride copolymer; styrene resins such as polystyrene, acrylonitrile.styrene copolymer, ABS, and α-methylstyrene.styrene copolymer; polyvinyl compounds such as polyvinyl chloride, polyvinylidene chloride, vinyl chloride.vinylidene chloride copolymer, methyl polyacrylate and methyl polymethacrylate; polyamides such as nylon 6, nylon 6-6, nylon 6-10, nylon 11 and nylon 12; thermoplastic polyesters such as polyethylene terephthalate (PET), polybutylene terephthalate and polyethylene naphthalate (PEN); polycarbonates; polyphenylene oxides; as well as polyimide resin, polyamideimide resin, polyetherimide resin, fluorine-contained resin, allyl resin, polyurethane resin, cellulose resin, polysulfone resin, polyethersulfone resin, ketone resin, amino resin, or biodegradable resins such as polylactic acid and the like, as well as blends thereof or those resins that are suitably modified by copolymerization, or those having a multilayer structure.

Specifically, for the use that requires transparency, polyester resins such as PET and PEN are preferred among the above resins and for the use that, further, requires heat resistance, polycarbonate and polyimide resin are preferred.

The above-mentioned resins may be blended with known blending agents for resins, such as antioxidant, lubricant, etc., as a matter of course.

There is no specific limitation on the form of the plastic base material 1 if it is capable of exhibiting barrier property against water to a sufficient degree, and the plastic base material 1 may assume any suitable form depending on the use. Most generally, however, the plastic base material 1 assumes the form of a plate, a film or a sheet.

The thickness and the like (e.g., flexibility, softness, strength, etc.) thereof are set to lie in suitable ranges depending on the use.

The plastic base material 1, depending on its form or the kind of the plastic material, can be formed by a known forming means, such as injection or co-injection forming, extrusion or co-extrusion forming, film- or sheet-forming, compression forming, or cast polymerization.

<Inorganic Barrier Layer 3>

The inorganic barrier layer formed on the plastic base material 1 is an inorganic vapor-deposited film such as a film formed by using various metals or metal oxides by the physical vapor deposition as represented by sputtering, vacuum evaporation or ion plating, or the chemical vapor deposition as represented by plasma CVD. Specifically preferably, the inorganic barrier layer is a vapor-deposited film formed by the plasma CVD from the standpoint of evenly forming the film even on rugged surfaces, the film being dense and maintaining high degree of adhesiveness to the plastic base material 1 and exhibiting excellent barrier property.

The film is formed by vapor deposition by the plasma CVD, i.e., by arranging the plastic base material 1 on which the inorganic barrier layer is to be formed in a plasma-treating chamber that maintains a predetermined degree of vacuum, feeding a gas (reaction gas) of a metal or a compound containing the metal for forming the film and an oxidizing gas (ordinary oxygen or NOx gas) together with a carrier gas such as argon or helium through a gas-feed pipe into the plasma-treating chamber which is shielded with a metal wall and is evacuated to a predetermined degree of vacuum, causing a glow discharge to take place in this state by applying microwave electric field or high-frequency electric field and, therefore, causing a plasma to generate based on the electric energy thereof so that the decomposition/reaction product of the compound is deposited on the surface of the plastic base material 1.

If the microwave electric field is employed, the film is formed by irradiating the interior of the plasma-treating chamber with the microwaves by using a waveguide. If the high-frequency electric field is employed, the film is formed by placing the plastic base material 1 between a pair of electrodes in the plasma-treating chamber and applying a high-frequency electric field to the electrodes.

As the reaction gas, it is desired to use a gas of an organometal compound such as an organoaluminum compound like trialkylaluminum, or organotitanium compound, organozirconium compound or organosilicon compound from the standpoint of forming a film on the surface of the plastic base material, the film having a flexible region containing carbon component and having, formed thereon, a region of a high degree of oxidation with excellent barrier property. Specifically, it is most desired to use an organosilicon compound from the standpoint of relatively easily and efficiently forming the inorganic barrier layer 3 having high barrier property against oxygen.

As the organosilicon compound, there can be used organosilane compounds such as hexamethyldisilane, vinyltrimethylsilane, methylsilane, dimethylsilane, trimethylsilane, diethylsilane, propylsilane, phenylsilane, methyltriethoxysilane, vinyltriethoxysilane, vinyltrimethoxysilane, tetramethoxysilane, tetraethoxysilane, phenyltrimethoxysilane, methyltrimethoxysilane and methyltriethoxysilane; and organosiloxane compounds such as octamethylcyclotetrasiloxane, 1,1,3,3-tetramethyldisiloxane and hexamethyldisiloxane. There can be, further, used aminosilane and silazane in addition to the above compounds.

The above-mentioned organometal compounds can be used alone or in a combination of two or more kinds.

In forming the film by the plasma CVD by using the above reaction gas of the organometal compound and the oxidizing gas, it is desired, according to the present invention, that the glow discharge output (e.g., microwave output or high-frequency output) is maintained small and after having started depositing the film with a small output, the film is then deposited by the plasma reaction with a large output.

Namely, the organic groups ($CH_3$, $CH_2$ and the like) contained in the molecules of the organometal compound, usually, volatilize in the form of $CO_2$. If the output is small, however, some of them do not decompose down to $CO_2$ but deposit on the surface of the plastic base material 1 and are contained in the film. If the output increases, on the other hand, the organic groups decompose down to $CO_2$. By increasing the output, therefore, it is made possible to decrease the content of C in the film and to forma film in which the metal contained in the organometal compound is oxidized to a high degree. Here, the film in which the metal is oxidized to a high degree has a very high barrier property against gases such as oxygen and the like, but has poor flexibility and does not adhere to the plastic base material 1 to a sufficient degree. On the other hand, the film in which the metal is oxidized to a low degree and which contains organic component in large amounts, does not have a sufficient degree of barrier property against the gases but is rich in flexibility and adheres to the plastic substrate 1 to a high degree.

According to the present invention as will be understood from the above description, an organometal compound is used as the reaction gas, the film is deposited by the plasma CVD with a small output in the initial stage of deposition and, thereafter, the output is increased to form, in a portion of the film that comes in contact with the surface of the plastic base material 1, a region that contains organic component (carbon) much and has a highly adhering property and, thereon, a region in which the metal is oxidized to a high degree and which has a high gas barrier property.

If the degree of oxidation of the metal (M) is denoted by x (x is an atomic ratio of O/M), it is desired that the inorganic barrier layer 3 in the gas barrier laminate 10 of the present invention has a degree of oxidation x in a region of as high as 1.5 to 2.0 in order to maintain excellent gas barrier property. On the lower side of the region of high oxidation degrees (on the side that comes in contact with the surface of the plastic base material 1), further, it is desired that an organic region is formed having a carbon (C) concentration of not less than 20 element % on the basis of three elements of metal (M), oxygen (O) and carbon (C). Further, the metal (M) is most desirably silicon (Si).

It is desired that the region of high degree of oxidation in the inorganic barrier layer 3 is present at a ratio of not less than 60% of the whole thickness of the inorganic barrier layer 3 and that the organic region is formed in a thickness of about 5 to about 40% of the whole thickness of the inorganic barrier layer 3 on the side where it comes in contact with the surface of the plastic base material 1.

The whole thickness of the inorganic barrier layer 3 may differ depending on the use of the gas barrier laminate 10 or the required level of gas barrier property but should, usually, be such that the properties of the plastic base material 1 are not impaired and is, desirably, as thin as 4 to 500 nm.

When the organic region and the region of high oxidation are to be formed in the inorganic barrier layer 3 by the plasma CVD, the output of glow discharge may differ to some extent depending on if microwaves are used or high-frequency waves are used. If, for example, microwaves are used, the organic region is formed with a small output of about 30 to about 100 W while the region of high oxidation is formed with a large output of not less than 90 W. If high-frequency waves are used, the organic region is formed with a small output of about 20 to about 80 W while the region of high oxidation is formed with a large output of not less than 100 W.

The time for forming the film may be so set that the thicknesses of the above regions lie in the above-mentioned ranges.

<Water-Trapping Layer 5>

The gas barrier laminate 10 of the present invention has the water-trapping layer 5 on the inorganic barrier layer 3. The water-trapping layer 5 includes a hygroscopic matrix formed by using the ionic polymer (a), and has a structure in which the hygroscopic agent (b) is dispersed in the matrix, the hygroscopic agent (b) being capable of attaining a humidity lower than a humidity that can be attained by using the matrix.

Namely, upon forming the water-trapping layer 5 of the dispersion structure on the inorganic barrier layer 3, it is allowed to realize a very great barrier property against water as described earlier.

As the ionic polymer (a) in the present invention, there can be used either the cationic polymer (a1) or the anionic polymer (a2). FIG. 1 shows an example of using the cationic polymer (a1) and FIG. 2 shows an example of using the anionic polymer (a2).

Hygroscopic Matrix (Ionic Polymer (a)).

Cationic Polymer (a1).

In the present invention, the cationic polymer (a1) used for forming the hygroscopic matrix is a polymer that has in the molecules thereof a cationic group that could become a positive electric charge in water, such as primary to tertiary amino group, quaternary ammonium group, pyridyl group, imidazole group or quaternary pyridinium group. The cationic polymer is capable of forming a hygroscopic matrix since the cationic group therein has a strong nucleophilic action and traps water by the hydrogen bond.

The amount of the cationic groups in the cationic polymer (a) is, usually, such that the coefficient of water absorption (JIS K-7209-1984) of the hygroscopic matrix that is formed is not less than 20% and, specifically, 30% to 45% in an atmosphere of a humidity of 80% RH and 30° C.

As the cationic polymer (a1), there is used the one obtained by polymerizing or copolymerizing at least one kind of a cationic monomer as represented by an amine monomer such as allylamine, ethyleneimine, vinylbenzyltrimethylamine, [4-(4-vinylphenyl)-methyl]-trimethylamine, or vinylbenzyltriethylamine; nitrogen-containing heterocyclic monomer such as vinylpyridine or vinylimidazole; or salts thereof; with other copolymerizable monomers and, further, as required, followed by the partial neutralization by the treatment with an acid.

As the other copolymerizable monomers, though not limited thereto only, there can be exemplified styrene, vinyltoluene, vinylxylene, α-methylstyrene, vinylnaphthalene, α-halogenated styrenes, acrylonitrile, acrolein, methyl vinyl ketone and vinylbiphenyl.

It is also allowable to obtain the cationic polymer (a1) by using a monomer having a functional group capable of introducing a cationic functional group, such as styrene, bromobutylstyrene, vinyltoluene, chloromethylstyrene, vinylpyridine, vinylimidasole, α-methylstyrene or vinylnaphthalene instead of using the above-mentioned cationic monomer, and after the polymerization thereof, conducting such a treatment as amination or alkylation (forming quaternary ammonium salt thereof).

In the present invention, among the above cationic polymers (a1), the polyallylamine is particularly preferred from the standpoint of forming the film.

The present invention uses the above cationic polymer (a1) as the ionic polymer (a) for forming the hygroscopic matrix. Upon using a crosslinking agent, therefore, it is allowed to introduce a crosslinked structure into the matrix to improve close adhesion of the water-trapping layer 5 to the inorganic barrier layer 3 without the need of using any particular closely adhering agent, which is an advantage. This will be described later.

The above cationic polymer (a1) is formed, usually, by the radical polymerization by heating using a polymerization initiator.

As the polymerization initiator, though not specifically limited, there can be typically used organic peroxides such as octanoyl peroxide, lauroyl peroxide, t-butylperoxy-2-ethyl hexanoate, benzoyl peroxide, t-butylperoxy isobutylate, t-butyl peroxy laurate, t-hexylperoxy benzoate, and di-t-butyl peroxide. Usually, the polymerization initiator is used in an amount of about 0.1 to 20 parts by weight and, specifically, about 0.5 to about 10 parts by weight per 100 parts by weight of the cationic monomer (or the monomer capable of introducing the cationic group).

The cationic polymer (a1) is obtained by conducting the polymerization as described above. If there is used the monomer capable of introducing the cationic functional groups, however, the treatment for introducing cationic groups, such as amination or alkylation, may be conducted after the polymerization.

In the present invention, it is desired to introduce the crosslinked structure into the hygroscopic matrix formed by using the cationic polymer (a1) from the standpoint of not lowering the hygroscopic capability, maintaining mechanical strength and, at the same time, improving dimensional stability. This also holds when there is used the anionic polymer (a2) that will be described later.

Namely, with the crosslinked structure being introduced into the hygroscopic matrix, even if the matrix has absorbed water, molecules of the cationic polymer (a1) are locked by each other due to the crosslinking. Therefore, an improved function is obtained for suppressing a change in the volume caused by swelling (absorption of water).

The above crosslinked structure can be introduced by adding the crosslinking agent to the coating composition for forming the water-trapping layer 5. A siloxane structure or an alicyclic structure is introduced into the crosslinked structure depending on the kind of the crosslinking agent to thereby form a spatial mesh structure adapted to absorbing moisture. Specifically, the crosslinking agent that works to introduce the siloxane structure is capable of enhancing adhesion to the inorganic barrier layer 3.

The crosslinked structure can also be introduced into the matrix formed by using the cationic polymer (a1) by polymerizing the polymerizable monomer for forming the cationic polymer (a1) after it has been blended with a polyfunctional monomer such as divinylbenzene. In this case, however, it becomes difficult to form the water-trapping layer 5 by using the coating composition that contains the cationic polymer (a1) (since the coating composition is dispersed less homogeneously and is applied less easily), which is not so desirable.

Anionic Polymer (a2).

In the present invention, the hygroscopic matrix can also be formed by using the anionic polymer (a2) as illustrated in FIG. 2.

The anionic polymer (a2) is a polymer that has in the molecules thereof an anionic functional group that could become a negative electric charge in water, such as carboxylic acid group, sulfonic acid group, phosphonic acid group, or acid base formed by partly neutralizing the above bases. The anionic polymer having such a functional group can forma hygroscopic matrix since the functional group traps water based on its hydrogen bond.

The amount of the anionic functional groups in the anionic polymer (a2), though dependent on the kind of the functional groups, may be such that the coefficient of water absorption (JIS K-7209-1984) of the hygroscopic matrix that is formed is not less than 20% and, specifically, 30% to 45% in an atmosphere of a humidity of 80% RH and 30° C.

As the anionic polymer (a2) having the above functional groups, there is used the one obtained by polymerizing or copolymerizing at least one kind of an anionic monomer as represented by a carboxylic acid monomer such as methacrylic acid, acrylic acid, or anhydrous maleic acid; sulfonic acid monomer such as α-halogenated vinylsulfonic acid, styrenesulfonic acid or vinylsulfonic acid; phosphonic acid monomer such as vinylphosphoric acid; or salts of monomers thereof; with other copolymerizable monomers and, further, as required, followed by the partial neutralization by the treatment with an alkali.

As the other copolymerizable monomers, though not limited thereto only, there can be exemplified styrene, vinyltoluene, vinylxylene, α-methylstyrene, vinylnaphthalene, α-halogenated styrenes, acrylonitrile, acrolein, methyl vinyl ketone and vinylbiphenyl.

It is also allowable to obtain the anionic polymer (a2) by using an ester of the above anionic monomer, or by using a monomer having a functional group capable of introducing an anionic functional group, such as styrene, vinyltoluene, vinylxylene, α-methylstyrene, vinylnaphthalene or α-halogenated styrenes instead of using the above-mentioned anionic monomer, and after the polymerization thereof, conducting such a treatment as hydrolysis, sulfonation, chlorosulfonation, or phosphoniation.

The anionic polymer (a2) preferably used in the present invention is a poly(meth)acrylic acid or a partly neutralized product thereof (e.g., a product thereof which is partly an Na salt).

The above anionic polymer (a2) is formed, usually, by the radical polymerization by heating using a polymerization initiator.

As the polymerization initiator, though not specifically limited, there can be typically used organic peroxides such as octanoyl peroxide, lauroyl peroxide, t-butylperoxy-2-ethyl hexanoate, benzoyl peroxide, t-butyl peroxyisobutylate, t-butylperoxylaurate, t-hexylperoxy benzoate, and di-t-butyl peroxide. Usually, the polymerization initiator is used in an amount of about 0.1 to 20 parts by weight and, specifically, about 0.5 to about 10 parts by weight per 100 parts by weight of the anionic monomer (or the monomer capable of introducing the anionic group).

The anionic polymer (a2) is obtained by conducting the polymerization as described above. If there is used the monomer capable of introducing the anionic functional groups, however, the treatment for introducing anionic groups, such as hydrolysis, sulfonation, chlorosulfonation or phosphoniation, may be conducted after the polymerization.

In the present invention, the crosslinked structure is introduced into the hygroscopic matrix that is formed by using the above anionic polymer (a2) making it, therefore, possible to further improve the water barrier property as well as to further improve the dimensional stability.

That is, unlike the cationic polymer, the anionic polymer traps water relying only on its hydrogen bond. To attain a sufficient degree of hygroscopic property, therefore, the anionic polymer must have the crosslinked structure therein. Specifically, it is desired to form in the matrix a spatial mesh structure adapted to absorbing moisture. By forming a hydrophobic portion like the alicyclic structure in the mesh structure, it is allowed to further improve the hygroscopic effect in the hydrophilic portion. Moreover, with the crosslinked structure being introduced into the hygroscopic matrix, even if the matrix has absorbed water, molecules of the anionic polymer (a2) are locked by each other due to the crosslinking thereby suppressing a change in the volume caused by swelling (absorption of water).

The above crosslinked structure can be introduced by adding the crosslinking agent to the coating composition for forming the water-trapping layer 5. The crosslinking agent used here will be described later.

The crosslinked structure can also be introduced into the matrix formed by using the anionic polymer (a2) by polymerizing the polymerizable monomer for forming the anionic polymer (a2) after it has been blended with a polyfunctional monomer such as divinylbenzene. In this case, however, it becomes difficult to form the water-trapping layer 5 by using the coating composition that contains the anionic polymer (a2) (since the coating composition is dispersed less homogeneously and is applied less easily), which is not so desirable.

Hygroscopic Agent (b).

In the present invention, the hygroscopic agent (b) is dispersed in the water-trapping layer 5 that uses the above ionic polymer (a) as the matrix (hygroscopic matrix). The hygroscopic agent is capable of attaining a humidity lower than a humidity that can be attained by using the ionic polymer (a) (cationic polymer (a1) or anionic polymer (a2)) that forms the hygroscopic matrix and, therefore, exhibits a very high hygroscopic capability. Namely, the water-trapping layer 5 contains, dispersed therein, the hygroscopic agent having hygroscopic property stronger than that of the matrix. Therefore, the water absorbed by the hygroscopic matrix is readily trapped by the hygroscopic agent; i.e., water that is absorbed is effectively confined within the matrix.

As a result, in the invention, the water that is trapped by the water-trapping layer 5 is effectively suppressed from being released. Besides, the water-trapping layer 5 effectively exhibits water-adsorbing capability even in an atmosphere of a very low humidity, while the hygroscopic matrix is effectively suppressed from swelling despite it has absorbed the water.

As the hygroscopic agent (b) that highly adsorbs moisture, there can be preferably used those that can attain a humidity of not higher than 6% in an environment of a humidity of 80% RH and a temperature of 30° C. provided that they can attain a humidity lower than a humidity that can be attained by using the cationic polymer (a1) or the anionic polymer (a2) as shown in the example described later. If the humidity attained by using the hygroscopic agent is higher than a humidity that is attained using the ionic polymer (a), then the water absorbed by the hygroscopic matrix cannot be confined to a sufficient degree but tends to be released, and greatly improved water barrier property cannot be expected. Further, despite the humidity that is attained is lower than that attained by the ionic polymer (a), water in an atmosphere of a low humidity cannot be trapped to a sufficient degree if the attained humidity measured under the above condition is higher than the above range and, in this case, water barrier property cannot often be exhibited to a sufficient degree.

The above hygroscopic agent (b), usually, has a coefficient of water absorption (JIS K-7209-1984) of not less than 50% in an environment of a humidity of 80% RH and a temperature of 30° C., and is either inorganic or organic.

As the inorganic hygroscopic agent, there can be exemplified clay minerals such as zeolite, alumina, activated charcoal and montmorillonite, as well as silica gel, calcium oxide and magnesium sulfate.

As the organic hygroscopic agent, there can be exemplified an anionic polymer or a crosslinked product of a partly neutralized product thereof. As the anionic polymer, there can be exemplified the one obtained by polymerizing at least one of the anionic monomers represented by carboxylic acid monomer ((meth)acrylic acid, anhydrous maleic acid, etc.), sulfonic acid monomers (halogenated vinyl sulfonate, styrenesulfonic acid, vinyl sulfonate, etc.), phosphonic acid monomers (vinylphosphoric acid, etc.) or salts of monomers thereof, or copolymerizing it with other monomers. Specifically, in the use where transparency is required, an organic hygroscopic agent is effectively used. For instance, fine particles of a crosslinked sodium poly(meth)acrylate can be representatively used as the organic hydroscopic agent.

In the invention, it is desired to use a hygroscopic agent having a small particle size (e.g., average primary particle size $D_{50}$ of not more than 100 nm and, specifically, not more than 80 nm calculated as volume measured by the laser diffraction scattering method) from the standpoint of attaining a large specific surface area and high hygroscopic property, and most desirably to use a hygroscopic agent of an organic polymer having a small particle size.

That is, the hygroscopic agent of the organic polymer disperses very well in the matrix of the ionic polymer (a), i.e., disperses homogeneously. Besides, by employing an emulsion polymerization or a suspension polymerization as a polymerization for the production thereof, the hygroscopic agent can be obtained in a fine particulate shape and in a uniform spherical shape. By adding the hygroscopic agent of the organic polymer in more than a certain amount, it is made possible to realize a very high degree of transparency. The transparency is attained presumably due to the fact that the particles of the hygroscopic agent of a fine and spherical shape are distributed like a layer near the interface between the water-trapping layer and the neighboring layer (e.g., inorganic barrier layer) suppressing the scattering of light in the interface. Specifically, maintaining the transparency could become a great advantage when the gas barrier laminate 10 is used as a substrate or a sealing layer for the organic EL panels.

Further, the organic fine hygroscopic agent can attain a very low humidity, has a high hygroscopic property, changes the volume very little despite it is swollen since it has been crosslinked and is, therefore, best adapted to bringing the environmental atmosphere to the absolutely dry state or to lowering the humidity close to the absolutely dry state yet suppressing a change in the volume.

As fine particles of the organic hygroscopic agent, there have been placed in the market fine particles of crosslinked Na polyacrylate (average particle size of about 70 nm) in the form of a colloidal dispersion solution (pH=10.4) in the trade name of TAFTIC HU-820E by Toyobo Co. There can be also favorably used fine particles of crosslinked potassium polyacrylate in which not less than 80% of the carboxyl groups have been neutralized with the potassium salt.

In the present invention, it is desired that the hygroscopic agent (b) is used in an amount in a suitable range depending on the kind of the ionic polymer (a) that forms the water-trapping layer 5 from the standpoint of exhibiting its properties to a sufficient degree, greatly improving the water barrier property, effectively suppressing a change in the size caused by swelling, and maintaining the water barrier property higher than the water barrier property of the inorganic barrier layer 3 over extended periods of time.

For instance, if the cationic polymer (a1) is used as the ionic polymer (a), it is desired that the hygroscopic agent (b) is used in an amount of not less than 50 parts by weight, specifically, in an amount of 100 to 900 parts by weight and, further desirably, in an amount of 200 to 600 parts by weight per 100 parts by weight of the cationic polymer (a1). Further, if the anionic polymer (a2) is used as the ionic polymer (a), it is desired that the hygroscopic agent (b) is used in an amount of not less than 50 parts by weight, specifically, in an amount of 100 to 1300 parts by weight and, further desirably, in an amount of 150 to 1200 parts by weight per 100 parts by weight of the anionic polymer (a2).

<Forming the Water-Trapping Layer 5 (Coating Composition)>

The water-trapping layer 5 having the matrix (hygroscopic matrix) formed by using the ionic polymer (a) and containing the hygroscopic agent (b) dispersed therein, is formed by using a coating composition obtained by dissolving or dispersing the ionic polymer (a) and the hygroscopic agent (b) in a solvent, applying the composition and drying the composition to remove the solvent.

The coating composition uses the ionic polymer (a) and the hygroscopic agent (b) in amounts at a ratio as described above. That is, the hygroscopic agent (b) is used in an amount of not less than 50 parts by weight per 100 parts by weight of the ionic polymer (a). Here, if the cationic polymer (a1) is used as the ionic polymer (a), the hygroscopic agent (b) is used preferably in an amount of 100 to 900 parts by weight and, specifically, 200 to 600 parts by weight per 100 parts by weight of the cationic polymer (a1). On the other hand, if the anionic polymer (a2) is used as the ionic polymer (a), the hygroscopic agent (b) is used preferably in an amount of 100 to 1300 parts by weight and, specifically, 150 to 1200 parts by weight per 100 parts by weight of the anionic polymer (a2).

The coating composition is, further, blended with the crosslinking agent for introducing the crosslinked structure into the hygroscopic matrix of the ionic polymer (a). That is, upon introducing the crosslinked structure as described earlier, it is made possible to maintain the mechanical strength without lowering the hygroscopic capability and, at the same time, to suppress the swelling (increase in the volume) caused by the absorption of water to thereby improve dimensional stability.

The crosslinking agent may differ depending on the kind of the ionic polymer (a).

If, for example, the cationic polymer (a1) is used as the ionic polymer (a), there can be used, as the crosslinking agent, a compound having a crosslinking functional group (e.g., epoxy group) that is capable of reacting with the cationic group possessed by the cationic polymer (a1) and a functional group (e.g., alkoxysilyl group) that is capable of forming a siloxane structure in the crosslinked structure through the hydrolysis and the dehydrating condensation. Specifically, there can be preferably used a silane compound represented by the following formula (1):

$$X\text{—}SiR^1{}_n(OR^2)_{3-n} \qquad (1)$$

wherein X is an organic group having an epoxy group at the terminal,
$R^1$ and $R^2$ are, respectively, methyl groups, ethyl groups or isopropyl groups, and
n is 0, 1 or 2.

The silane compound of the formula (1) has an epoxy group and an alkoxysilyl group as functional groups, and the epoxy group undergoes the additional reaction with the functional group (e.g., $NH_2$ group) of the cationic polymer (a1). On the other hand, the alkoxysilyl group forms a silanol group (SiOH group) through the hydrolysis, which grows into a siloxane structure through the condensation reaction to finally form a crosslinked structure among the cationic polymer chains. Thus a crosslinked structure having the siloxane structure is introduced into the matrix of the cationic polymer (a1). On the other hand, the silanol group formed by the hydrolysis of the alkoxysilyl group undergoes the dehydrating condensation with the MOH group (M: metal element) such as SiOH group (silanol group) present on the surface of the inorganic barrier layer 3, and firmly bonds thereto.

Besides, in this case, the ionic polymer (a) forming the matrix is the cationic polymer (a1) and, therefore, the coating liquid is alkaline. This, as a result, accelerates the addition reaction of the cationic groups with the epoxy groups, or the dehydrating condensation among the silanol groups or with the MOH groups on the surface of the inorganic barrier layer 3.

By using the compound of the above formula (1) as the crosslinking agent, therefore, it is made possible to introduce the crosslinked structure into the matrix and, at the same time, to improve close adhesion between the water-trapping layer 5 and the inorganic barrier layer 3.

Specifically, with the siloxane structure being introduced into the crosslinked structure, the close adhesion to the inorganic barrier layer 3 is also improved.

In the invention, the organic group X having the epoxy group in the above formula (1) is representatively a γ-glycidoxyalkyl group. Therefore, for example, a γ-glycidoxypropyltrimethoxysilane or a γ-glycidoxypropylmethyldimethoxysilane can be preferably used as the crosslinking agent.

Further, the one in which the epoxy group in the above formula (1) is an alicyclic epoxy group such as epoxycyclohexyl group can also be preferably used as the crosslinking agent. For example, if a compound having an alicyclic epoxy group such as β-(3,4-epoxycyclohexyl)ethyltrimethoxysilane is used as the crosslinking agent, the alicyclic structure is introduced together with the siloxane structure into the crosslinked structure of the matrix. Introduction of the alicyclic structure makes it possible to more effectively exhibit the function of the matrix of forming a spatial mesh structure adapted to absorbing moisture.

Further, in the invention, to introduce the alicyclic structure into the crosslinked structure, it is allowable to use, as the crosslinking agent, a compound having a plurality of epoxy groups and alicyclic groups, e.g., a diglycidyl ester represented by the following formula (2),

wherein G is a glycidyl group, and
A is a divalent hydrocarbon group having an aliphatic ring, such as cycloalkylene group.

The diglycidyl ester is representatively expressed by the following formula (2-1),

[Chemical 1]

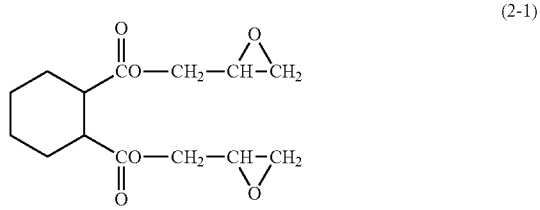

The diglycidyl ester of the formula (2) has no alkoxysilyl group and works poorly for enhancing the close adhesion to the inorganic barrier layer 3 but works to introduce the alicyclic structure into the crosslinked structure. It's use is, therefore, effective in forming the spatial mesh structure adapted to absorbing moisture in the matrix.

In the present invention, if the cationic polymer (a1) is used as the ionic polymer (a), the crosslinking agent is used in an amount of 5 to 60 parts by weight and, specifically, 15 to 50 parts by weight per 100 parts by weight of the cationic polymer (a1). It is desired that not less than 70% by weight and, preferably, not less than 80% by weight of the crosslinking agent is the silane compound of the formula (1) described above.

If the crosslinking agent is used in too large amounts, the water-trapping layer 5 becomes brittle in terms of mechanical strength and its handling property becomes poor. When the coating material is prepared, therefore, its viscosity increases so quickly that it would become difficult to maintain an effective pot life. If the amount of the crosslinking agent is too small, on the other hand, it becomes difficult to maintain the durability (e.g., mechanical strength) of the coating composition when it is exposed to severe environmental conditions (e.g., highly humid conditions). Further, if the silane compound of the above formula (1) is used at a small ratio, adhesion to the inorganic barrier layer 3 decreases.

In the invention, further, if the anionic polymer (a2) is used as the ionic polymer (a), there can be used, as the crosslinking agent, a compound having not less than 2 crosslinking functional groups (e.g., epoxy groups) capable of reacting with the anionic groups possessed by the anionic polymer (a2). Specifically, there can be used the diglycidyl ester represented by the above formula (2), i.e.,

wherein G is a glycidyl group, and
A is a divalent hydrocarbon group having an aliphatic ring, such as cycloalkylene group.

That is, the diglycidyl ester is the same compound as the one that is used for introducing the alicyclic structure into the crosslinked structure when the cationic polymer (a1) is used. By using the diglycidyl ester, two epoxy groups react with the anionic groups in the anionic polymer (a2), and the matrix possesses formed therein a crosslinked structure that includes the alicyclic structure formed by the divalent group A.

Upon forming the crosslinked structure that includes the alicyclic structure, the anionic polymer (a2) has its molecules locked and is suppressed from swelling. Specifically, from the standpoint of forming a spatial mesh structure adapted to absorbing moisture, it is particularly desired that the diglycidyl ester is the one in which the aliphatic ring included in the divalent organic group A is a cyclohexane ring. More preferably, the diglycidyl ester is the one in which the two ester groups are formed at positions to where the cyclohexane rings are neighboring. The diglycidyl ester of such a structure is expressed by the above-mentioned formula (2-1).

In the invention, if the anionic polymer (a2) is used as the ionic polymer (a), it is desired that the crosslinking agent is used in an amount of 1 to 50 parts by weight and, specifically, 10 to 40 parts by weight per 100 parts by weight of the cationic polymer (a2). If the crosslinking agent is used in too large amounts, the water-trapping layer 5 becomes brittle in terms of mechanical strength and its handling property becomes poor. Besides, when the coating material is prepared, its viscosity increases so quickly that it would become difficult to maintain an effective pot life. If the amount of the crosslinking agent is too small, on the other hand, it becomes difficult to maintain the durability (e.g., mechanical strength) of the coating composition when it is exposed to severe environmental conditions (e.g., highly humid conditions).

In the invention, further, if the anionic polymer (a2) is used as the ionic polymer (a), it is desired that the coating composition for forming the water-trapping layer 5 is blended with a closely adhering agent (c) for improving close adhesion between the water-trapping layer 5 and the inorganic barrier layer 3.

The closely adhering agent has functional groups that are reactive with the surface of the inorganic barrier layer 3 and with the matrix of the anionic polymer (a2). That is, the closely adhering agent (c) has an epoxy group and an alkoxysilyl group, and is, desirably, a silane compound represented by the following formula (1):

$$X—SiR^1_n(OR^2)_{3-n} \quad (1)$$

wherein X is an organic group having an epoxy group at the terminal,
$R^1$ and $R^2$ are, respectively, methyl groups, ethyl groups or isopropyl groups, and
n is 0, 1 or 2.

That is the silane compound is a compound that is used as the crosslinking agent if the cationic polymer (a1) is used as the ionic polymer (a).

In the silane compound, the silanol group (SiOH group) formed by the hydrolysis of the alkoxysilyl group undergoes the dehydrocondensation with MOH (M is a metal element such as Si forming the inorganic barrier layer) distributed on the surface of the inorganic barrier layer 3. Therefore, the siloxane structure is introduced into the matrix, and the closely adhering agent (c) (silane compound) closely adheres and bonds to the surface of the inorganic barrier layer 3 due to the siloxane bond. Further, the epoxy group in the silane compound reacts (esterifies) with the acid group (e.g., COOH) and salts thereof (e.g., COONa) possessed by the anionic polymer (a2), and bonds thereto. Therefore, the closely adhering agent also bonds to the matrix of the water-trapping layer 5.

Thus, the closely adhering agent enhances close adhesion between the inorganic barrier layer 3 and the water-trapping layer 5, improves the junction strength and, as a result, effectively prevents the water-trapping layer 5 from peeling and works to maintain water barrier property of a high degree over extended periods of time.

Specifically, if the inorganic barrier layer 3 is a vapor deposited film formed by the plasma CVD of an organosilicon compound, the SiOH groups are distributed on the surfaces thereof permitting the siloxane bond to form easily between the water-trapping layer 5 (matrix) and the inorganic barrier layer 3 and presenting very great effect for improving the close adhesion.

Among the silane compounds of the above formula (1), those having a plurality of alkoxysilyl groups (n is 0 or 1 in the formula (1)) are desired, such as γ-glycidoxypropyltrimethoxysilane and γ-glycidoxypropylmethyldimethoxysilane. Further, those in which the epoxy group is an alicyclic epoxy group such as epoxycyclohexyl group, e.g., β-(3,4-epoxycyclohexyl)ethyltrimethoxysilane and the like, are most desired as the closely adhering agent (c).

In the invention, it is desired that the above closely adhering agent (c) is present in an amount of 0.1 to 10 parts by weight and, specifically, 1 to 8 parts by weight per 100 parts by weight of the anionic polymer (a2) in the water-trapping layer 5 so as to exhibit its property to a sufficient degree without impairing the water barrier property.

In the invention, any solvent can be used without limitation for the coating composition that contains the above-mentioned various components so far as it can be volatilized and removed by heating at a relatively low temperature. For instance, there can be used an alcohol solvent such as methanol, ethanol, propyl alcohol or butanol; a ketone solvent such as acetone or methyl ethyl ketone; a mixed solvent of the above solvent with water; water; or an aromatic hydrocarbon solvent such as benzene, toluene or xylene. Specifically, however, it is desired to use water or a mixed solvent containing water in order to accelerate the hydrolysis of the silane compound that has an alkoxysilyl group in the crosslinking agent in the coating composition.

The above solvent is used in such an amount that the coating composition will assume a viscosity adapted to being applied. Here, however, a non-ionic polymer can also be added in a suitable amount to adjust the viscosity of the coating composition or to adjust the coefficient of water absorption of the formed hygroscopic matrix so as to lie in a suitable range.

As the non-ionic polymer, there can be exemplified polyvinyl alcohol; saturated aliphatic hydrocarbon polymers such as ethylene-propylene copolymer, polybutylene and the like; styrene polymers such as styrene-butadiene copolymer and the like; polyvinyl chloride; or the polymers thereof copolymerized with various comonomers (e.g., styrene monomers such as vinyltoluene, vinylxylene, chlorostyrene, chloromethylstyrene, α-methylstyrene, α-halogenated styrene, and α,β,β'-trihalogenated styrene; monoolefins such as ethylene and butylene; and conjugated diolefins such as butadiene and isoprene).

In the invention, the above coating composition is applied, for example, onto the surface of the inorganic barrier layer 3, and is heated at about 80 to about 160° C. for several seconds to several minutes depending on the power of the oven so that the solvent is removed. Here, further, the crosslinking agent reacts with the cationic polymer (a1) and with the MOH on the surface of the inorganic barrier layer 3, whereby the crosslinked structure is introduced into the matrix and the water-trapping layer 5 is formed featuring excellent adhesiveness to the inorganic barrier layer 3.

There is no specific limitation on the thickness of the water-trapping layer 5, and a suitable thickness may be selected depending on the use and the degree of water barrier that is required. Usually, however, the thickness of at least not less than 1 μm and, specifically, about 2 to about 20 μm will be sufficient to realize such a super barrier property that the water vapor permeability is not more than $10^{-6}$ g/m$^2$/day.

That is, in the present invention, the water-trapping layer 5 has double functions of absorbing water and confining water. By forming only one water-trapping layer 5 having a suitable thickness on the inorganic barrier layer 3, therefore, it is allowed to realize a super barrier property against water as described above. Accordingly, the present invention makes it possible to obtain a high barrier property with a decreased number of layers, and is very advantageous from the standpoint of productivity and cost of production.

<Other Layers>

In the present invention, though there is no need of providing any particular layer on the water-trapping layer 5, it is also allowable to provide any known layers that have been formed for the gas barrier laminates of this kind within a range in which they do not impair the advantage of the present invention.

For instance, there can be provided a water-repelling layer such as an olefin resin layer in order to reliably prevent the release of water from the water-trapping layer 5 and to avoid a decrease in the electric insulation that could be caused by water that is released.

To further improve barrier property against oxygen, there can be provided an oxygen barrier layer of an ethylene.vinyl alcohol copolymer or an aromatic polyamide, or an oxygen-absorbing layer that contains a transition metal such as iron, cobalt or the like.

To maintain adhesion among the above-mentioned layers and the water-trapping layer 5, further, there can be provided adhesive resin layers comprising an olefin resin graft-modified with an unsaturated carboxylic anhydride such as maleic anhydride.

The above-mentioned layers can be easily formed by known means such as coextrusion or coating.

<Use>

The gas barrier laminate 10 of the present invention has very excellent water barrier property, and can be preferably used as a film for sealing various kinds of electronic devices or electronic circuits such as organic EL elements, solar cells, electronic papers and the like. Further, if the plastic film base material 1 is made from a material having excellent transparency, such as PET, PEN, polycarbonate or polyimide resin, then it is allowed to form transparent electrodes thereon and, further thereon, organic EL devices and solar luminescent devices having a luminescent layer.

EXAMPLES

Excellent properties of the gas barrier laminates of the invention will now be described by way of the following Experiments.

Here in the following Experiments, various properties were evaluated by the methods described below.

<Evaluating the Attained Humidity>

The ionic polymer (a) and the hydroscopic agent (b) were dried at 140° C. for one hour. 0.5 Grams of the material to be measured and a wireless thermometer/hygrometer (Hygroclone, manufactured by KN Laboratories Co.) were put into a cup of a water-impermeable steel-foiled laminate having a volume of 85 cm$^3$. The mouth of the container was heat-sealed with a lid of an aluminum foil-laminated film. After left to stand at 30° C. 80% RH for one day, the relative humidity in the container was regarded as the attained humidity.

<Measuring the Moisture Permeability (g/m$^2$/day)>

By using a moisture permeation measuring apparatus ("Permatran-W" manufactured by Modern Control Co.), the gas barrier laminates were measured for their moisture permeabilities in compliance with the ASTM-F1249 under a condition of a temperature of 40° C. and a relative humidity of 90%. Those in excess of the limit of measurement but less than 0.01 g/m$^2$/day were evaluated to be ○ and those not less than 0.01 g/m$^2$/day were evaluated to be X.

<Measuring Hazes>

By using an SM color computer (SM-4, manufactured by Suga Shikenki Co.), the gas barrier laminates were measured for their hazes in compliance with the JIS-K7361-1. Those having hazes of less than 5% were evaluated to be ○ and those of not less than 5% were evaluated to be X.

<Strength of Close Adhesion>

To maintain the strength of the film against the tensile testing, aluminum foils of a thickness of 7 μm were dry-laminated on both surfaces of the sample laminate via urethane adhesive layers of a thickness of 4 μm. To cure the adhesive layers, the sample laminate was aged at 50° C. for 3 days to thereby prepare a sample for T-peel testing.

The sample for T-peel testing was cut into a strip measuring 100 mm×15 mm. By using a tensile testing machine, the strip was tested for its T-peeling at a tension speed of 300 mm/min. (N=3).

The average strength was regarded to be a strength of close adhesion, and the samples of not less than 2 (N/15 mm) were evaluated to be ○, those of not less than 1 (N/15 mm) but less than 2 (N/15 mm) were evaluated to be Δ, and those of less than 1 (N/15 mm) were evaluated to be X.

<Preparation of PET Films Coated with the Inorganic Barrier Layer>

In the following experiment, the water-trapping layer was formed on the PET (polyethylene terephthalate) film coated with the inorganic barrier layer by the following method.

By using a plasma CVD apparatus, an inorganic barrier layer 3 of silicon oxide was formed on one surface of a biaxially stretched PET film 1 having a thickness of 12 μm. Described below were the conditions for preparing the film.

There was used a CVD apparatus equipped with a high-frequency output power source of a frequency of 27.12 MHz and a maximum output of 2 kW, a matching box, a metallic cylindrical plasma-treating chamber of a diameter of 300 mm and a height of 450 mm, and a hydraulic rotary vacuum pump for evacuating the treating chamber.

A plastic base member was placed on flat parallel plates in the treating chamber, a hexamethyldisiloxane was introduced at a rate of 3 sccm, oxygen was introduced at a rate of 45 sccm, and a 50-watt high-frequency output was generated by the high-frequency oscillator for 2 seconds to form a closely adhered layer. Next, a 300-watt high-frequency output was generated by the high-frequency oscillator for 15 seconds to form an inorganic barrier layer.

The thus obtained inorganic barrier layer-coated PET film exhibited a water vapor permeability of 0.1 g/m$^2$/day as measured in an atmosphere of a humidity of 90% RH and a temperature of 40° C.

<Experiment 1>

The experiment conducted here demonstrates the effects of the embodiments of when the water barrier layer is formed by using, as the matrix polymer, the cationic polymer (a1) that is the ionic polymer (a).

Example 1-1

The following polyallylamine was provided as the cationic polymer.

Polyallylamine:

PAA-15C, aqueous solution containing 15% of solid component, manufactured by Nittobo Medical Co.

Further, the following crosslinked product of Na polyacrylate was provided as the hygroscopic agent.

Crosslinked Product of Na Polyacrylate:

TAFTIC HU-820E, aqueous dispersion containing 13% of solid component, average grain size ($D_{50}$), 70 nm, manufactured by Toyobo Co.

A polymer solution was obtained by diluting the above polyallylamine with water such that the solid component was 5% by weight. On the other hand, a solution of the crosslinking agent was prepared by dissolving a γ-glycidoxypropyltrimethoxysilane, as the crosslinking agent, in water such that the amount thereof was 5% by weight.

Next, the polymer solution and the solution of the crosslinking agent were mixed together such that the amount of the γ-glycidoxypropyltrimethoxysilane was 20 parts by weight per 100 parts by weight of the matrix polymer or the polyallylamine. To the mixed solution was, further, added, as the hygroscopic agent, the above crosslinked product of Na polyacrylate (HU-820E) in an amount of 420 parts by weight with respect to the polyallylamine, and to which was, further, added water such that the amount of the solid component was 5%. The mixture was stirred well to obtain a coating solution for forming the water-trapping layer.

By using a bar coater, the above coating solution was applied onto the vapor-deposited surface 3 of the inorganic barrier layer-coated PET film that has been prepared in advance. The film after applied with the coating solution was heat-treated in a box-type electric oven under the conditions of a peak temperature of 120° C. and a peak temperature-holding time of 10 seconds. There was obtained a film 10 coated with the water-trapping layer 5 of a thickness of 4 μm.

Figure 4:
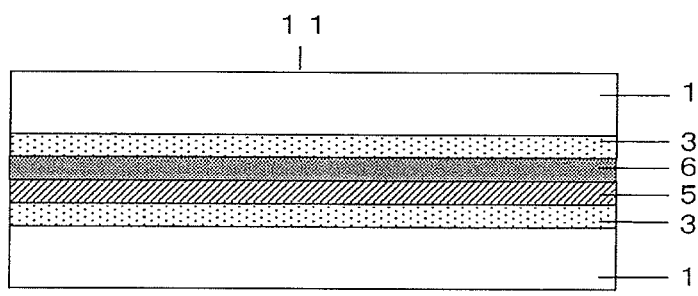
FIG. 4 is a sectional view schematically showing the structure of layers of a laminate prepared in Example 1-1 of Experiment 1 and Example 2-1 of Experiment 2.

Next, in a globe box in which the nitrogen concentration has been adjusted to be not less than 99.95%, the inorganic barrier layer-coated PET film was dry-laminated on the coating of the above coated film 10 via a layer 6 of urethane adhesive of a thickness of 4 μm such that the vapor-deposited surface 3 was on the inside. In order to cure the adhesive resin layer so will not to adsorb moisture, the laminate was aged in vacuum at 50° C. for 3 days. There was obtained a laminate 11 of a layer structure as shown in FIG. 4.

Example 1-2

A laminate 11 was obtained in the same manner as in Example 1-1 but adding the hygroscopic agent in an amount of 50 parts by weight with respect to the polyallylamine.

Example 1-3

A laminate 11 was obtained in the same manner as in Example 1-1 but adding the hygroscopic agent in an amount of 1000 parts by weight with respect to the polyallylamine.

Example 1-4

A laminate 11 was obtained in the same manner as in Example 1-1 but mixing the polymer solution and the solution of the crosslinking agent such that the amount of the crosslinking agent or the γ-glycidoxypropyltrimethoxysilane was 7 parts by weight with respect to the polyallylamine and, further, adding the hygroscopic agent in an amount of 375 parts by weight with respect to the polyallylamine.

Example 1-5

A laminate 11 was obtained in the same manner as in Example 1-1 but mixing the polymer solution and the solution of the crosslinking agent such that the amount of the crosslinking agent or the γ-glycidoxypropyltrimethoxysilane was 50 parts by weight with respect to the polyallylamine and, further, adding the hygroscopic agent in an amount of 525 parts by weight with respect to the polyallylamine.

Example 1-6

A laminate 11 was obtained in the same manner as in Example 1-1 but adding no crosslinking agent or no γ-glycidoxypropyltrimethoxysilane and adding the hygroscopic agent in an amount of 150 parts by weight with respect to the polyallylamine.

Example 1-7

A laminate 11 was obtained in the same manner as in Example 1-1 but using a polyethyleneimine (Polyethyleneimine 10000 manufactured by Junsei Kagaku Co.) as the cationic polymer that served as the matrix polymer.

Example 1-8

A laminate 11 was obtained in the same manner as in Example 1-1 but using a β-(3,4-epoxycyclohexyl)ethyltrimethoxysilane as the crosslinking agent.

Example 1-9

A laminate 11 was obtained in the same manner as in Example 1-1 but mixing the polymer solution and the solution of the crosslinking agent such that the amount of the crosslinking agent or the γ-glycidoxypropyltrimethoxysilane was 16 parts by weight with respect to the polyallylamine and, further, adding a diglycidyl 1,2-cyclohexanedicarboxylate as the crosslinking agent in an amount of 4 parts by weight with respect to the polyallylamine.

Example 1-10

A laminate 11 was obtained in the same manner as in Example 1-1 but using a mixed solvent of water and acetone (weight ratio of 80/20) instead of water as the solvent in the coating solution, adding, as the crosslinking agent, the diglycidyl 1,2-cyclohexanedicarboxylate in an amount of 20 parts by weight per 100 parts by weight of the polyallylamine, and adding the hygroscopic agent in an amount of 180 parts by weight with respect to the polyallylamine.

Example 1-11

Figure 5:
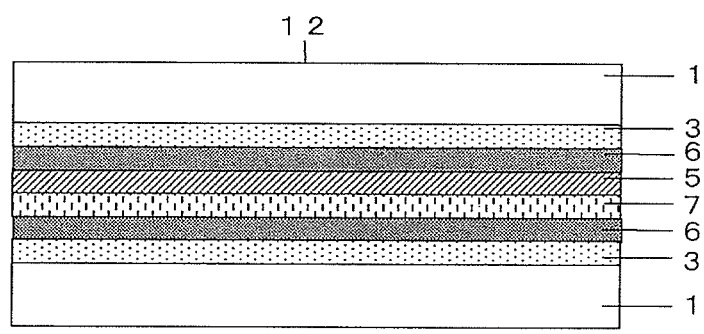
FIG. 5 is a sectional view schematically showing the structure of layers of a laminate prepared in Example 1-11 of Experiment 1 and Example 2-12 of Experiment 2.

A laminate 12 of a layer structure shown in FIG. 5 was obtained by the same method as in Example 1-1 but dry-laminating a biaxially stretched nylon film 7 of a thickness of 15 μm on the vapor-deposited surface 3 of the inorganic barrier layer-coated PET film via a layer 6 of urethane adhesive of a thickness of 4 μm, and forming the water-trapping layer 5 on the nylon film 7.

Example 1-12

A sample laminate 11 was obtained by the same method as in Example 1-1 but using a commercially available vapor-deposited PET film (Techbarrier Type T, manufactured by Mitsubishi Jushi Co.) formed by the PVD method instead of using the inorganic barrier layer-coated PET film.

Example 1-13

A sample laminate 11 was obtained by the same method as in Example 1-1 but using the Zeolite 3A (aqueous dispersion, solid content of 22%, manufactured by Mizusawa Kagaku Co.) as the hygroscopic agent.

Example 1-14

A crosslinked product of the following K polyacrylate was provided as the hygroscopic agent.
Crosslinked Product of K Polyacrylate:
  By using an ion-exchanging resin (Amberlite 200CT manufactured by Organo Co.), Na salt-type carboxyl groups of the crosslinked product (HU-820E) of the Na polyacrylate were converted into H-type carboxyl groups. Thereafter, by using a 1N aqueous solution of potassium hydroxide, there was obtained a crosslinked product of K polyacrylate having potassium salt-type carboxyl groups (aqueous dispersion, solid content of 10%, average particle size $D_{50}$: 70 mn, neutralization degree of 80%).

A sample laminate 11 was obtained by the same method as in Example 1-1 but using the above crosslinked product of K polyacrylate as the hygroscopic agent.

Comparative Example 1-1

A sample laminate 11 was obtained by the same method as in Example 1-1 but adding neither the hygroscopic agent nor the crosslinking agent.

Comparative Example 1-2

A sample laminate 11 was obtained by the same method as in Example 1-1 but using a polyvinyl alcohol (PVA103 manufactured by Kuraray Co.) instead of using the matrix polymer or the cationic polymer.

Comparative Example 1-3

A crosslinked product of the following Na polyacrylate was provided as the hygroscopic agent.
Crosslinked Product of Na Polyacrylate:
TAFTIC HU-700E, aqueous dispersion, solid component 20%,
average grain size $D_{50}$: 900 nm, manufactured by Toyobo Co.

A sample laminate 11 was obtained by the same method as in Example 1-1 but using the above crosslinked product (HU-700E) of Na polyacrylate as the hygroscopic agent.

Comparative Example 1-4

A crosslinked product of the following Na polyacrylate was provided as the hygroscopic agent.
Crosslinked Product of Na Polyacrylate:
TAFTIC HU-720SF, powder, average grain size: 4 μm, manufactured by Toyobo Co.

100 Parts by weight of a low-density polyethylene (LU-MITAC 08L55A manufactured by Toso Co.) was dry-blended with 43 parts by weight of the above crosslinked product of Na polyacrylate (HU-720SF). The mixture thereof was kneaded at 150° C. by using a biaxial kneader/extruder and, by using two pieces of PET films of a thickness of 12 μm and a laminating machine, was so taken up that the water-trapping layer 5 assumed a thickness of 20 μm between the two PET films, i.e., that both surfaces of the water-trapping layer 5 were protected with the PET films.

Figure 6:
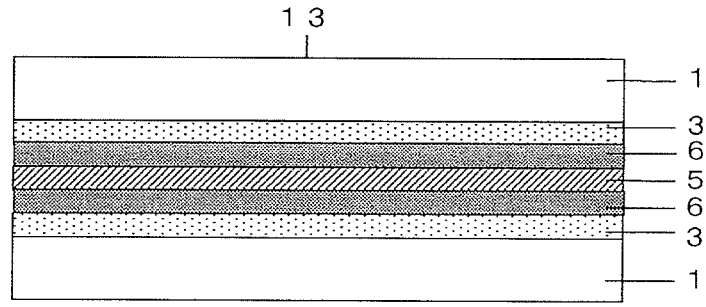
FIG. 6 is a sectional view schematically showing the structure of layers of a laminate prepared in Comparative Example 1-4 of Experiment 1 and Comparative Example 2-6 of Experiment 2.

In a globe box in which the nitrogen concentration has been adjusted to be not less than 99.95%, the PET films were removed, and the sample was dry-laminated on both surfaces thereof with the inorganic barrier-coated PET films used in Example 1, via 4-μm thick urethane adhesive layers 6, such that the vapor-deposited surfaces 3 were on the inside. To cure the adhesive resin layers so will not to absorb moisture, the laminate was aged at 50° C. for 3 days. There was obtained a laminate 13 having a layer structure as shown in FIG. 6.

<Evaluation and Test>

The sample laminates prepared above were measured for their properties by the methods described above. The results were as shown in Tables 1 and 2.

In the evaluation of close adhesion, if the peeling occurs in places other than the interface between the water-trapping layer and the vapor-deposited surface of the inorganic barrier layer-coated PET, it means that the close adhesion between the water-trapping layer and the vapor-deposited surface of the inorganic barrier layer-coated PET is larger than the values shown in Tables (note 1).

The hygroscopic agent used in Examples 1 to 13 was of the inorganic type, and was not intended to be used for the applications that required transparency. Therefore, the haze was not evaluated (note 2).

The following abbreviations were used in Tables 1 and 2.
MTXPLM: matrix polymer
PAA: polyallylamine
PEI: polyethyleneimine
PVOH: polyvinyl alcohol
LDPE: low-density polyethylene
γ-GPSL: γ-glycidoxypropyltrimethoxysilane
β-EPSL: β-(3,4-epoxycyclohexyl)ethyltrimethoxysilane
1,2-CHDG: diglycidyl 1,2-cyclohexanedicarboxylate
K-type PAC: crosslinked product of K polyacrylate In Tables 1 and 2, further, the amounts of the hygroscopic agents and the crosslinking agents are per 100 parts by weight of the matrix polymer.

TABLE 1

| | MTXPLM (amount) | Attained humidity (% RH) | Hygroscopic agent (amount) | Attained humidity (% RH) | Crosslinking agent (amount) |
|---|---|---|---|---|---|
| Ex. 1-1 | PAA (100) | 7.1 | HU-820E (420) | 0.0 | γ-GPSL (20) |
| Ex. 1-2 | PAA (100) | 7.1 | HU-820E (50) | 0.0 | γ-GPSL (20) |
| Ex. 1-3 | PAA (100) | 7.1 | HU-820E (1000) | 0.0 | γ-GPSL (20) |
| Ex. 1-4 | PAA (100) | 7.1 | HU-820E (375) | 0.0 | γ-GPSL (7) |
| Ex. 1-5 | PAA (100) | 7.1 | HU-820E (525) | 0.0 | γ-GPSL (50) |
| Ex. 1-6 | PAA (100) | 7.1 | HU-820E (180) | 0.0 | — |
| Ex. 1-7 | PEI (100) | 7.3 | HU-820E (420) | 0.0 | γ-GPSL (20) |
| Ex. 1-8 | PAA (100) | 7.1 | HU-820E (420) | 0.0 | β-EPSL (20) |
| Ex. 1-9 | PAA (100) | 7.1 | HU-820E (420) | 0.0 | γ-GPSL (16), 1,2-CHDG(4) |
| Ex. 1-10 | PAA (100) | 7.1 | HU-820E (180) | 0.0 | 1,2-CHDG (20) |
| Ex. 1-11* | PAA (100) | 7.1 | HU-820E (420) | 0.0 | γ-GPSL (20) |
| Ex. 1-12** | PAA (100) | 7.1 | HU-820E (420) | 0.0 | γ-GPSL (20) |
| Ex. 1-13 | PAA (100) | 7.1 | zeolite 4A (180) | 0.0 | γ-GPSL (20) |
| Ex. 1-14 | PAA (100) | 7.1 | K-type PAC (420) | 0.0 | γ-GPSL (20) |

TABLE 1-continued

|  | Moisture permeability (g/m2/day) | Close adhesion (note 1) (N/15 mm) | Haze (%) | Water-trapping layer, thickness (μm) |
|---|---|---|---|---|
| Ex. 1-1 | ○ (<0.01) | ⊚ (>6.6) | ○ (3.9) | 4 |
| Ex. 1-2 | ○ (<0.01) | ⊚ (>5.9) | ○ (4.3) | 4 |
| Ex. 1-3 | ○ (<0.01) | ⊚ (>6.2) | ○ (3.5) | 4 |
| Ex. 1-4 | ○ (<0.01) | ○ (>3.2) | ○ (3.7) | 4 |
| Ex. 1-5 | ○ (<0.01) | ⊚ (>7.1) | ○ (3.1) | 4 |
| Ex. 1-6 | ○ (<0.01) | ⊚ (>6.0) | ○ (3.4) | 4 |
| Ex. 1-7 | ○ (<0.01) | ⊚ (>7.1) | ○ (2.6) | 4 |
| Ex. 1-8 | ○ (<0.01) | ⊚ (>7.9) | ○ (3.2) | 4 |
| Ex. 1-9 | ○ (<0.01) | ⊚ (>6.9) | ○ (4.0) | 4 |
| Ex. 1-10 | ○ (<0.01) | ⊚ (>6.0) | ○ (3.1) | 4 |
| Ex. 1-11* | ○ (<0.01) | ⊚ (>6.9) | ○ (3.9) | 4 |
| Ex. 1-12** | ○ (<0.01) | ⊚ (>6.5) | ○ (3.4) | 4 |
| Ex. 1-13 | ○ (<0.01) | ⊚ (>5.9) | note 2 | 4 |
| Ex. 1-14 | ○ (<0.01) | ⊚ (>6.9) | ○ (3.2) | 4 |

*The inorganic barrier layer and water-trapping layer are not neighboring to each other.
**Using a commercially available PET film formed by the PVD method.

TABLE 2

|  | MTXPLM (amount) | Attained humidity (% RH) | Hygroscopic agent (amount) | Attained humidity (% RH) | Crosslinking agent (amount) |
|---|---|---|---|---|---|
| Comp. Ex. 1-1 | PAA (100) | 7.1 | — | — | — |
| Comp. Ex. 1-2* | PVOH (100) | 68.0 | HU-820E (420) | 0.0 | γ-GPSL (20) |
| Comp. Ex. 1-3 | PAA (100) | 7.1 | HU-700E (420) | 8.2 | γ-GPSL (20) |
| Comp. Ex. 1-4** | LDPE (100) | 77.0 | HU-720SF (43) | 9.0 | — |

|  | Moisture permeability (g/m2/day) | Close adhesion (note 1) (N/15 mm) | Haze (%) | Water-trapping layer, thickness (μm) |
|---|---|---|---|---|
| Comp. Ex. 1-1 | X (0.05) | ⊚ (>6.6) | ○ (2.9) | 4 |
| Comp. Ex. 1-2* | X (0.05) | ⊚ (>6.6) | ○ (4.2) | 4 |
| Comp. Ex. 1-3 | X (0.05) | ⊚ (>7.2) | ○ (4.9) | 4 |
| Comp. Ex. 1-4** | X (0.05) | ⊚ (>6.6) | ○ (6.0) | 20 |

*Nonionic polymer is used in the matrix.
**Hygroscopic agent is mixed into the polyethylene.

Figure 7:
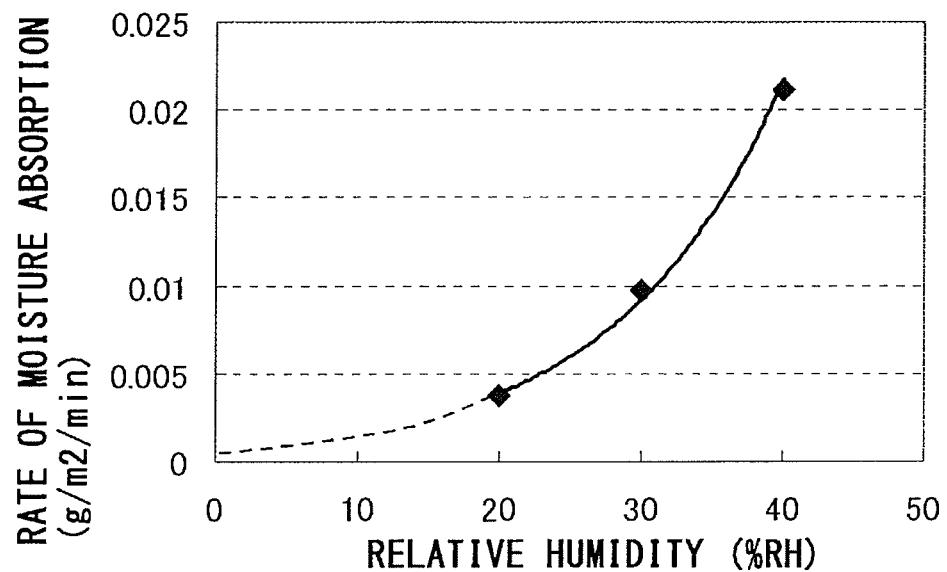
FIG. 7 is a graph illustrating how to find a hygroscopic rate in Applied Experiment 1.

Applied Experiment 1;

0.5 Grams of a composition comprising 100 parts by weight of a cationic polymer (polyallylamine), 420 parts by weight of a hygroscopic agent (TAFTIC HU-820E) and 20 parts by weight of a cross-linking agent (γ-glycidoxypropyltrimethoxysilane), was dried at 140° C. for one hour and was measured for its weight. Thereafter, the composition was left to stand in atmospheres of a temperature of 30° C. and humidities of 20, 30 and 40% RH each for 5 minutes, and was measured for its weight again. From the increments of weight that were found, the rates of absorbing moisture of the water-trapping layer were calculated at each of the humidities. Further, a rate of absorbing moisture in an atmosphere of a very low humidity was found by extrapolation (see FIG. 7).

The rate of absorbing moisture of the water-trapping layer in the atmosphere of a very low humidity as found by extrapolation was $10^{-4}/m^2/min$ while the inorganic barrier layer-coated PET film used in Example 1-1 had a water vapor permeability in an atmosphere of a humidity of 90% RH and a temperature of 40° C. of 0.1 $g/m^2/day$, i.e., $10^{-5}$ $g/m^2/min$. Therefore, the water-trapping layer of the present invention is capable of trapping moisture even in an atmosphere of a very low humidity and is capable of trapping moisture at a rate very higher than a rate of moisture permeation through the inorganic barrier layer.

Further, the following experiment was conducted in order to prove the confinement of the moisture in the hygroscopic agent trapped from the matrix. 0.5 Grams of the sample to be measured was dried at 140° C. for one hour and was put into a cup of a water-impermeable steel-foiled laminate having a volume of 85 $cm^3$ together with a wireless thermometer/hygrometer (Hygroclone, manufactured by KN Laboratories Co.) in an atmosphere of 30° C. 80% RH. The mouth of the container was heat-sealed with a lid of an aluminum foil-laminated film. The sample was left to stand for one day. Thereafter, the sample was left to stand at temperatures of −20, 5, 22, 30 and 40° C. each for 3 hours. Relative humidities in the container were regarded as the attained humidities at each of the temperatures.

Figure 8:
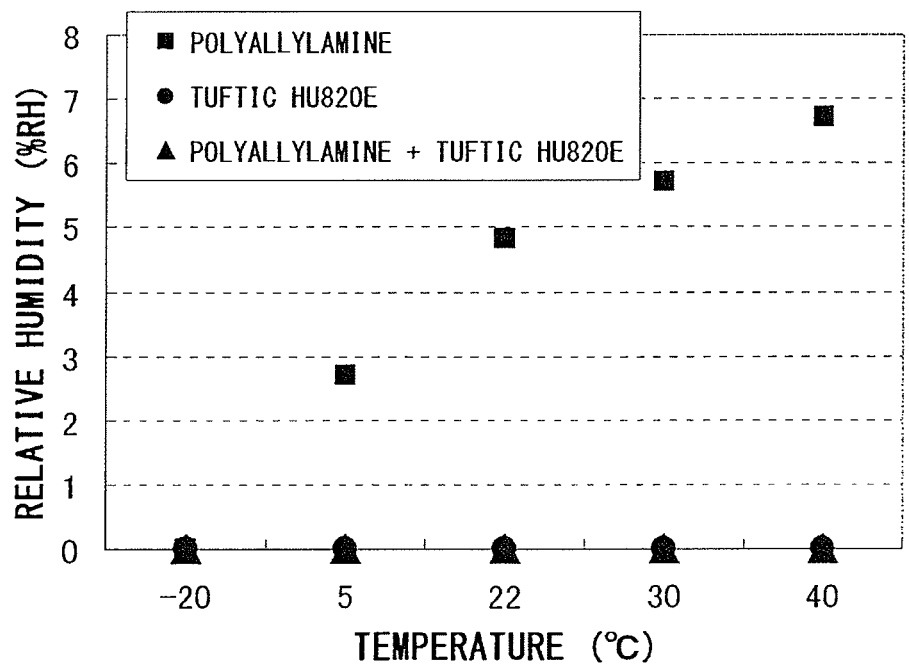
FIG. 8 is a graph illustrating relationships between the temperature and the relative humidity (attained humidity) in Applied Experiment 1.

FIG. 8 shows humidifies attained by using the cationic polymer (polyallylamine), the hygroscopic agent (TAFTIC HU-820E), and a mixture of the cationic polymer and the hygroscopic agent at a ratio of 1:1 at each of the temperatures. As the temperature rose, the cationic polymer permitted the humidity to rise in the container while both the hygroscopic agent and the mixture of the cationic polymer and the hygroscopic agent worked to lower the humidity in the container down to the absolutely dry state. Since the mixture exhibits the hygroscopic capability equivalent to that of when the hygroscopic agent alone is used, it is learned that the moisture absorbed by the cationic polymer is not released to the exterior despite of a rise in the temperature but remains trapped more reliably due to the hygroscopic agent that has a large hygroscopic capability (i.e., a low humidity is attained).

<Experiment 2>

The experiment conducted here demonstrates the effects of the embodiments of when the water barrier layer is formed by using, as the matrix polymer, the cationic polymer (a2) that is the ionic polymer (a).

Example 2-1

The following polyacrylic acid was provided as the anionic polymer.
Polyacrylic Acid:
　AC-10LP, manufactured by Nihon-Junyaku Co.
Further, the following crosslinked product of Na polyacrylate was provided as the hygroscopic agent.
Crosslinked Product of Na Polyacrylate:
　TAFTIC HU-820E, aqueous dispersion containing 13% of solid component, average grain size ($D_{50}$), 70 nm, manufactured by Toyobo Co.

A polymer solution containing a partly neutralized product of polyacrylic acid (i.e., matrix polymer) dissolved therein was obtained by diluting the above polyacrylic acid with a water/acetone mixed solvent (weight ratio of 80/20) such that the solid component was 5% by weight, and adding the sodium hydroxide such that the polyacrylic acid was neutralized to a degree of 80%. To the polymer solution, there were, further, added 20 parts by weight of a diglycidyl 1,2-cyclohexanedicarboxylate (crosslinking agent) per 100 parts by weight of the partly neutralized product of polyacrylic acid, 3 parts by weight of a β-(3,4-epoxycyclohexyl)ethyltrimethoxysilane (closely adhering agent), and 431 parts by weight of the hygroscopic agent provided above. To the mixture was further added, with good stirring, the water/acetone mixed solvent (weight ratio of 80/20) in such an amount the whole solid component was 5% by weight to thereby prepare a coating solution.

By using a bar coater, the above coating solution was applied onto the vapor-deposited surface 3 of the inorganic barrier layer-coated PET film that has been prepared in advance. The film after applied with the coating solution was heat-treated in a box-type electric oven under the conditions of a peak temperature of 120° C. and a peak temperature-holding time of 10 seconds. There was obtained a film 10 coated with the water-trapping layer 5 of a thickness of 4 μm.

Next, in a globe box in which the nitrogen concentration has been adjusted to be not less than 99.95%, the inorganic barrier layer-coated PET film was dry-laminated on the coating of the above coated film 10 via a layer 6 of urethane adhesive of a thickness of 4 μm such that the vapor-deposited surface 3 was on the inside. In order to cure the adhesive resin layer so will not to adsorb moisture, the laminate was aged in vacuum at 50° C. for 3 days. There was obtained a laminate 11 of a layer structure as shown in FIG. 4.

Example 2-2

A laminate 11 was obtained in the same manner as in Example 2-1 but adding the granular hygroscopic agent in an amount of 50 parts by weight.

Example 2-3

A laminate 11 was obtained in the same manner as in Example 2-1 but adding the hygroscopic agent in an amount of 1300 parts by weight.

Example 2-4

A sample laminate 11 was obtained in the same manner as in Example 2-1 but changing the amount of the diglycidyl 1,2-cyclohexanedicarboxylate (crosslinking agent) into 1 part by weight and changing the amount of the hygroscopic agent to 364 parts by weight.

Example 2-5

A sample laminate 11 was obtained in the same manner as in Example 2-1 but changing the amount of the diglycidyl 1,2-cyclohexanedicarboxylate (crosslinking agent) into 50 part by weight and changing the amount of the hygroscopic agent to 536 parts by weight.

Example 2-6

A sample laminate 11 was obtained in the same manner as in Example 2-1 but changing the amount of the β-(3,4-epoxycyclohexyl)ethyltrimethoxysilane (closely adhering agent) into 0.3 parts by weight and changing the amount of the hygroscopic agent to 422 parts by weight.

Example 2-7

A sample laminate 11 was obtained in the same manner as in Example 2-1 but changing the amount of the β-(3,4-epoxycyclohexyl)ethyltrimethoxysilane (closely adhering agent) into 10 parts by weight and changing the amount of the hygroscopic agent to 455 parts by weight.

Example 2-8

A laminate 11 was obtained in the same manner as in Example 2-1 but changing the degree of neutralization of the partly neutralized product of polyacrylic acid that is the matrix polymer into 10%, adding no β-(3,4-epoxycyclohexyl)ethyltrimethoxysilane (closely adhering agent), and changing the amount of the hygroscopic agent to 150 parts by weight.

Example 2-9

As the anionic polymer, there was provided a polyvinyl alcohol imparted with anionic property (Kurare K Polymer KM-118, manufactured by Kuraray Co.).
A sample laminate 11 was obtained in the same manner as in Example 2-1 but changing the partly neutralized product of the polyacrylic acid that is the matrix polymer into the above anionic polyvinyl alcohol, changing the amount of the β-(3,4-epoxycyclohexyl)ethyltrimethoxysilane (closely adhering agent) to 8 parts by weight, and changing the amount of the hygroscopic agent to 640 parts by weight.

Example 2-10

A laminate 11 was obtained in the same manner as in Example 2-1 but changing the degree of neutralization of the partly neutralized product of polyacrylic acid into 50%, changing the crosslinking agent into the ethylene glycol diglycidyl ether, and changing the heat-treating temperature at the time of forming the water-trapping layer into 160° C.

Example 2-11

A laminate 11 was obtained in the same manner as in Example 2-1 but changing the closely adhering agent into 5 parts by weight of the γ-glycidoxypropyltrimethoxysilane and changing the amount of the hygroscopic agent into 438 parts by weight.

Example 2-12

A biaxially stretched nylon film 7 of a thickness of 15 μm was dry-laminated on the vapor-deposited surface 3 of the inorganic barrier layer-coated PET film via a layer 6 of urethane adhesive of a thickness of 4 μm.

A laminate 12 of a layer structure shown in FIG. 5 was obtained in the same manner as in Example 1 but forming the water-trapping layer 5 on the nylon film 7.

Example 2-13

A sample laminate 11 was obtained by the same method as in Example 2-1 but using a commercially available vapor-deposited PET film (Techbarrier Type T, manufactured by Mitsubishi Jushi Co.) formed by the PVD method instead of using the inorganic barrier layer-coated PET film.

Example 2-14

A crosslinked product of the following K polyacrylate was provided as the hygroscopic agent.
Crosslinked Product of K Polyacrylate:
By using an ion-exchanging resin (Amberlite 200CT manufactured by Organo Co.), Na salt-type carboxyl groups of the crosslinked product (HU-820E) of the Na polyacrylate were converted into H-type carboxyl groups. Thereafter, by using a 1N aqueous solution of potassium hydroxide, there was obtained a crosslinked product of K polyacrylate having potassium salt-type carboxyl groups (aqueous dispersion, solid content of 10%, average particle size $D_{50}$: 70 mn, neutralization degree of 80%).

A sample laminate 11 was obtained by the same method as in Example 2-1 but using the above crosslinked product of K polyacrylate as the hygroscopic agent.

Comparative Example 2-1

A sample laminate 11 was obtained by the same method as in Example 2-1 but adding neither the hygroscopic agent nor the crosslinking agent.

Comparative Example 2-2

A sample laminate 11 was obtained by the same method as in Example 2-1 but adding no hygroscopic agent.

Comparative Example 2-3

A laminate 11 was obtained by the same method as in Example 2-1 but adding no crosslinking agent and changing the amount of the granular hygroscopic agent to 361 parts by weight.

Comparative Example 2-4

A sample laminate 11 was obtained by the same method as in Example 2-1 but using a polyvinyl alcohol (PVA103 manufactured by Kurarey Co.) instead of using the partly neutralized product of polyacrylic acid that is the matrix polymer.

Comparative Example 2-5

A crosslinked product of the following Na polyacrylate was provided as the hygroscopic agent.
Crosslinked Product of Na Polyacrylate:
TAFTIC HU-700E, aqueous dispersion, solid component 20%,
average grain size $D_{50}$: 900 nm, manufactured by Toyobo Co.

A sample laminate 11 was obtained by the same method as in Example 2-1 but using the above crosslinked product (HU-700E) of Na polyacrylate as the hygroscopic agent.

Comparative Example 2-6

A crosslinked product of the following Na polyacrylate was provided as the hygroscopic agent.
Crosslinked Product of Na Polyacrylate:
TAFTIC HU-720SF, powder, average grain size: 4 μm, manufactured by Toyobo Co.

The above crosslinked product of Na polyacrylate (HU-720SF) was used as the hygroscopic agent. 100 Parts by weight of a low-density polyethylene (LUMITAC 08L55A manufactured by Toso Co.) was dry-blended with 43 parts by weight of the above hygroscopic agent, and the mixture thereof was kneaded at 150° C. by using a biaxial kneader/extruder to prepare a composition for forming the water-trapping layer.

By using a laminating machine, the water-trapping layer 5 (thickness: 20 μm) comprising the above composition was formed between two pieces of PET films of a thickness of 12 μm. Next, in a globe box in which the nitrogen concentration has been adjusted to be not less than 99.95%, the PET films were removed, and the sample was dry-laminated on both surfaces thereof with the inorganic barrier layer-coated PET films used in Example 1, via 4 μm-thick urethane adhesive layers 6, such that the vapor-deposited surfaces 3 were on the inside. To cure the adhesive resin layers 6 so will not to absorb moisture, the laminate was aged at 50° C. for 3 days. There was obtained a laminate 13 having a layer structure as shown in FIG. 6.

<Evaluation and Test>

The sample laminates prepared above were measured for their properties by the methods described above. The results were as shown in Tables 3 and 4.

In the evaluation of close adhesion, if the peeling occurs in places other than the interface between the water-trapping layer and the vapor-deposited surface of the inorganic barrier layer-coated PET, it means that the close adhesion between the water-trapping layer and the vapor-deposited surface of the inorganic barrier layer-coated PET is larger than the values shown in Tables (note 1).

The following abbreviations were used in Tables 3 and 4.
MTXPLM: matrix polymer
PACNa: neutralized product of Na type polyacrylic acid
AN-PVOH: anionic polyvinyl alcohol
LDPE: low-density polyethylene
1,2-CHDG: diglycidyl 1,2-cyclohexanedicarboxylate
EGDGE: ethylene glycol diglycidyl ether
β-EPSL: β-(3,4-epoxycyclohexyl)ethyltrimethoxysilane
γ-GPSL: γ-glycidoxypropyltrimethoxysilane
K-type PAC: crosslinked product of K polyacrylate In Tables 3 and 4, further, the amounts of the hygroscopic agent, crosslinking agent and closely adhering agent are per 100 parts by weight of the matrix polymer.

of a hygroscopic agent (TAFTIC HU-820E), 20 parts by weight of a cross-linking agent (diglycidyl 1,2-cyclohexanedicarboxylate) and 3 parts by weight of a closely

TABLE 3

| | MTXPLM (amount) | Neutralization (%) | Attained humidity (% RH) | Hygroscopic agent (amount) | Attained humidity (% RH) | Crosslinking agent (amount) |
|---|---|---|---|---|---|---|
| Ex. 2-1 | PACNa (100) | 80 | 7.9 | HU-820E (431) | 0.0 | 1,2-CHDG (20) |
| Ex. 2-2 | PACNa (100) | 80 | 7.9 | HU-820E (50) | 0.0 | 1,2-CHDG (20) |
| Ex. 2-3 | PACNa (100) | 80 | 7.9 | HU-820E (1300) | 0.0 | 1,2-CHDG (20) |
| Ex. 2-4 | PACNa (100) | 80 | 7.9 | HU-820E (364) | 0.0 | 1,2-CHDG (1) |
| Ex. 2-5 | PACNa (100) | 80 | 7.9 | HU-820E (536) | 0.0 | 1,2-CHDG (50) |
| Ex. 2-6 | PACNa (100) | 80 | 7.9 | HU-820E (422) | 0.0 | 1,2-CHDG (20) |
| Ex. 2-7 | PACNa (100) | 80 | 7.9 | HU-820E (455) | 0.0 | 1,2-CHDG (20) |
| Ex. 2-8 | PACNa (100) | 10 | 25.3 | HU-820E (150) | 0.0 | 1,2-CHDG (20) |
| Ex. 2-9 | AN-PVOH (100) | 0 | 35.0 | HU-820E (640) | 0.0 | 1,2-CHDG (20) |
| Ex. 2-10 | PACNa (100) | 50 | 18.0 | HU-820E (431) | 0.0 | EGDGE (20) |
| Ex. 2-11 | PACNa (100) | 80 | 7.9 | HU-820E (438) | 0.0 | 1,2-CHDG (20) |
| Ex. 2-12 | PACNa (100) | 80 | 7.9 | HU-820E (431) | 0.0 | 1,2-CHDG (20) |
| Ex. 2-13 | PACNa (100) | 80 | 7.9 | HU-820E (431) | 0.0 | 1,2-CHDG (20) |
| Ex. 2-14 | PACNa (100) | 80 | 7.9 | K-type PAC (431) | 0.0 | 1,2-CHDG (20) |

| | contacting agent (amount) | Permeability (g/m2/day) | Close adhesion (note 1) (N/15 mm) | Haze (%) | Water-trapping layer, thickness (μm) |
|---|---|---|---|---|---|
| Ex. 2-1 | β-EPSL (3) | ○ (<0.01) | ○ (2.1) | ○ (4.1) | 4 |
| Ex. 2-2 | β-EPSL (3) | ○ (<0.01) | ○ (2.5) | ○ (3.9) | 4 |
| Ex. 2-3 | β-EPSL (3) | ○ (<0.01) | ○ (2.0) | ○ (3.7) | 4 |
| Ex. 2-4 | β-EPSL (3) | ○ (<0.01) | ○ (2.2) | ○ (4.2) | 4 |
| Ex. 2-5 | β-EPSL (3) | ○ (<0.01) | ○ (2.0) | ○ (3.5) | 4 |
| Ex. 2-6 | β-EPSL (0.3) | ○ (<0.01) | ○ (2.1) | ○ (3.9) | 4 |
| Ex. 2-7 | β-EPSL (10) | ○ (<0.01) | ○ (2.9) | ○ (4.5) | 4 |
| Ex. 2-8 | — | ○ (<0.01) | ○ (2.0) | ○ (3.7) | 4 |
| Ex. 2-9 | β-EPSL (8) | ○ (<0.01) | ○ (3.3) | ○ (4.4) | 4 |
| Ex. 2-10 | β-EPSL (3) | ○ (<0.01) | ○ (2.2) | ○ (4.5) | 4 |
| Ex. 2-11 | γ-EPSL (5) | ○ (<0.01) | ○ (2.6) | ○ (3.8) | 4 |
| Ex. 2-12 | β-EPSL (3) | ○ (<0.01) | ○ (2.8) | ○ (4.1) | 4 |
| Ex. 2-13 | β-EPSL (3) | ○ (<0.01) | ○ (2.4) | ○ (4.6) | 4 |
| Ex. 2-14 | β-EPSL (3) | ○ (<0.01) | ○ (2.5) | ○ (4.1) | 4 |

\* The inorganic barrier layer and water-trapping layer are not neighboring to each other.
\*\* Using a commercially available PET film formed by the PVD method.

TABLE 4

| | MTXPLM (amount) | Neutralization (%) | Attained humidity (% RH) | Hygroscopic agent (amount) | Attained humidity (% RH) | Crosslinking agent (amount) |
|---|---|---|---|---|---|---|
| Comp. Ex. 2-1 | PACNa (100) | 80 | 7.9 | — | — | — |
| Comp. Ex. 2-2 | PACNa (100) | 80 | 7.9 | — | — | 1,2-CHDG (20) |
| Comp. Ex. 2-3 | PACNa (100) | 80 | 7.9 | HU-820E (361) | 0.0 | — |
| Comp. Ex. 2-4* | PVOH (100) | — | 68.0 | HU-820E (431) | 0.0 | 1,2-CHDG (20) |
| Comp. Ex. 2-5 | PACNa (100) | 80 | 7.9 | HU-700E (431) | 8.2 | 1,2-CHDG (20) |
| Comp. Ex. 2-6** | LDPE (100) | — | 77.0 | HU-720SF (43) | 9.0 | — |

| | contacting agent (amount) | Permeability (g/m2/day) | Close adhesion (note 1) (N/15 mm) | Haze (%) | Water-trapping layer, thickness (μm) |
|---|---|---|---|---|---|
| Comp. Ex. 2-1 | β-EPSL (3) | X (0.05) | ○ (2.3) | ○ (3.3) | 4 |
| Comp. Ex. 2-2 | β-EPSL (3) | X (0.05) | ○ (2.8) | ○ (3.2) | 4 |
| Comp. Ex. 2-3 | β-EPSL (3) | X (0.05) | ○ (2.3) | ○ (3.0) | 4 |
| Comp. Ex. 2-4* | β-EPSL (3) | X (0.05) | ○ (>6.6) | ○ (4.2) | 4 |
| Comp. Ex. 2-5 | β-EPSL (3) | X (0.05) | ○ (2.6) | ○ (3.8) | 4 |
| Comp. Ex. 2-6** | — | X (0.05) | ○ (>6.6) | X (6.0) | 20 |

\*Nonionic polymer is used in the matrix.
\*\*Hygroscopic agent is mixed into the polyethylene.

<Applied Experiment 2>

Figure 9:
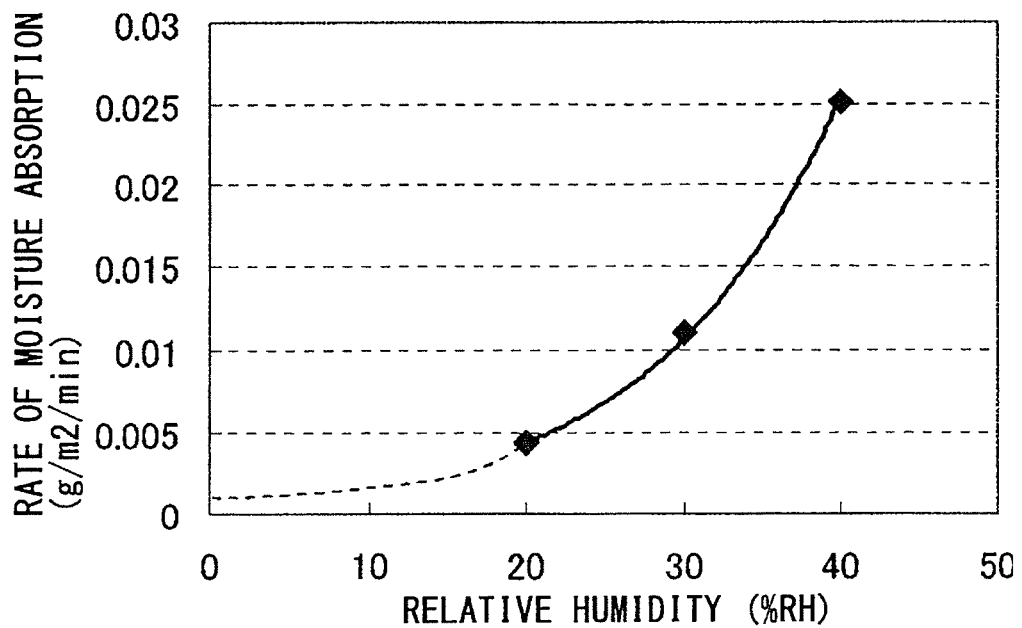
FIG. 9 is a graph illustrating how to find a hygroscopic rate in Applied Experiment 2.

0.5 Grams of a composition comprising 100 parts by weight of a anionic polymer (partly neutralized product of polyacrylic acid, partly neutralized with sodium hydroxide, degree of partial neutralization: 80%), 420 parts by weight of a hygroscopic agent (TAFTIC HU-820E), 20 parts by weight of a cross-linking agent (diglycidyl 1,2-cyclohexanedicarboxylate) and 3 parts by weight of a closely adhering agent (2-(3,4-epoxycyclohexyl)ethyltrimethoxysilane), was dried at 140° C. for one hour and was measured for its weight. Thereafter, the composition was left to stand in atmospheres of a temperature of 30° C. and humidities of 20 to 40% RH for 5 minutes, and was measured for its weight again. From the increments of weight that were found, the rates of absorbing moisture of the water-trapping layer were calculated at each of the humidities. Further, a rate of absorbing moisture in an atmosphere of a very low humidity was found by extrapolation (see FIG. 9).

The rate of absorbing moisture of the water-trapping layer in the atmosphere of a very low humidity as found by extrapolation was $10^{-4}/m^2/min$ while the inorganic barrier layer-coated PET film used in Example 2-1 had a water vapor permeability in an atmosphere of a humidity of 90% RH and a temperature of 40° C. of 0.1 $g/m^2/day$, i.e., $10^{-5}$ $g/m^2/min$. Therefore, the water-trapping layer of the present invention is capable of trapping moisture even in an atmosphere of a very low humidity and is capable of trapping moisture at a rate very higher than a rate of moisture permeation through the inorganic barrier layer.

Further, the following experiment was conducted in order to prove the confinement of the moisture in the hygroscopic agent trapped from the matrix. 0.5 Grams of the sample to be measured was dried at 140° C. for one hour and was put into a cup of a water-impermeable steel-foiled laminate having a volume of 85 cm³ together with a wireless thermometer/hygrometer (Hygroclone, manufactured by KN Laboratories Co.) in an atmosphere of 30° C. 80% RH. The mouth of the container was heat-sealed with a lid of an aluminum foil-laminated film. The sample was left to stand for one day. Thereafter, the sample was left to stand at temperatures of −20, 5, 22, 30 and 40° C. each for 3 hours. Relative humidities in the container were regarded as the attained humidities at each of the temperatures.

Figure 10:
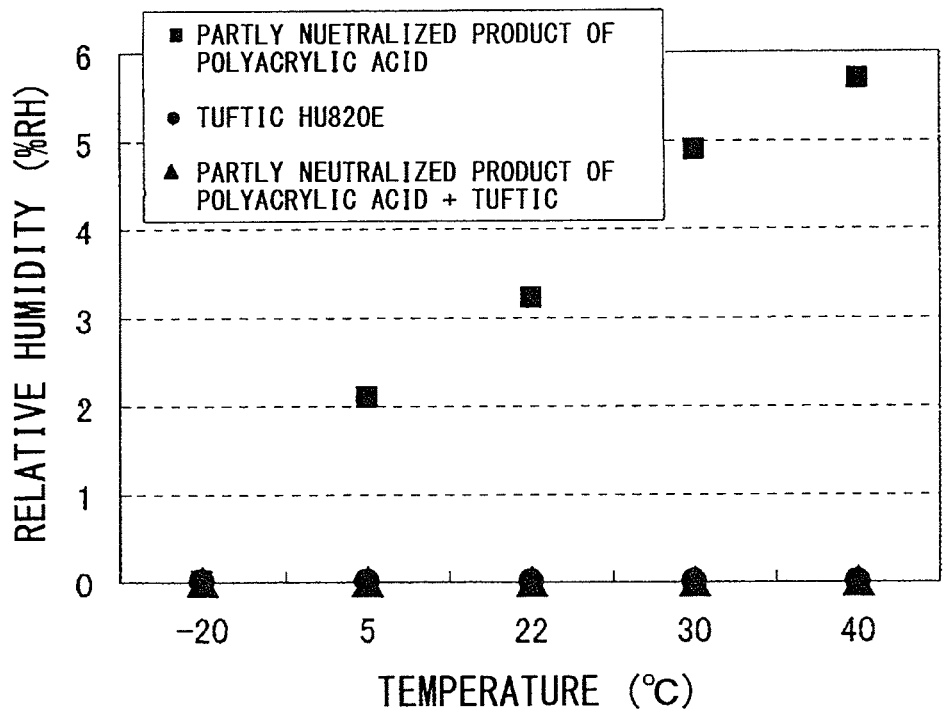
FIG. 10 is a graph illustrating relationships between the temperature and the relative humidity (attained humidity) in Applied Experiment 2.

FIG. 10 shows humidifies attained by using the anionic polymer (partly neutralized product of polyacrylic acid, degree of partial neutralization: 80%), the hygroscopic agent (TAFTIC HU-820E), and a mixture of the anionic polymer and the hygroscopic agent at a ratio of 1:1 at each of the temperatures.

As the temperature rose, the anionic polymer permitted the humidity to rise in the container while both the hygroscopic agent and the mixture of the anionic polymer and the hygroscopic agent worked to lower the humidity in the container down to the absolutely dry state. Since the mixture exhibits the hygroscopic capability equivalent to that of when the hygroscopic agent alone is used, it is learned that the moisture absorbed by the cationic polymer is not released to the exterior despite of a rise in the temperature but remains trapped more reliably due to the hygroscopic agent that has a large hygroscopic capability (i.e., a low humidity is attained).

DESCRIPTION OF REFERENCE NUMERALS

1: plastic base material
3: inorganic barrier layer
5: water-trapping layer
6: layers of urethane adhesive
7: biaxially stretched nylon film
10, 11, 12, 13: gas barrier laminates

The invention claimed is:
1. A gas barrier laminate comprising an inorganic barrier layer and a water-trapping layer that are formed on a plastic base material, the water-trapping layer including a matrix of an ionic polymer (a) in which is distributed a hygroscopic agent (b) comprising a crosslinked product of a monovalent metal salt of a poly(meth)acrylic acid having such a hygroscopic property as to attain a humidity lower than a humidity that can be attained by the matrix in the absence of the hygroscopic agent (b).

2. The gas barrier laminate according to claim 1, wherein said inorganic barrier layer is an inorganic oxide film formed by the CVD method.

3. The gas barrier laminate according to claim 1, wherein said water-trapping layer and the inorganic barrier layer are contiguous to each other.

4. The gas barrier laminate according to claim 1, wherein said ionic polymer (a) is a cationic polymer (a1).

5. The gas barrier laminate according to claim 4, wherein a crosslinked structure is introduced into said matrix.

6. The gas barrier laminate according to claim 5, wherein said crosslinked structure includes a siloxane structure or an alicyclic structure.

7. The gas barrier laminate according to claim 1, wherein said ionic polymer (a) is an anionic polymer (a2), and said matrix of said anionic polymer (a2) contains a crosslinked structure.

8. The gas barrier laminate according to claim 7, wherein said matrix of an anionic polymer (a2) contains a siloxane structure and an alicyclic structure.

9. The gas barrier laminate according to claim 8, wherein said water-trapping layer is blended with an adhering agent (c) having a functional group that is reactive with the matrix and a surface of the inorganic barrier layer.

10. The gas barrier laminate according to claim 9, wherein said adhering agent (c) is a compound having an alicyclic epoxy group and an alkoxysilyl group.

11. A coating composition obtained by dissolving or dispersing, in a solvent, an ionic polymer (a), a hygroscopic agent (b) comprising a crosslinked product of a monovalent metal salt of a poly(meth)acrylic acid having such a hygroscopic property as to attain a humidity lower than a humidity that can be attained by said ionic polymer (a) in the absence of the hygroscopic agent (b), and a crosslinking agent.

12. The coating composition according to claim 11, wherein said ionic polymer (a) is a cationic polymer (a1).

13. The coating composition according to claim 12, wherein said hygroscopic agent (b) is contained in an amount of 50 to 1000 parts by weight and said crosslinking agent is contained in an amount of 5 to 60 parts by weight per 100 parts by weight of said cationic polymer (a1).

14. The coating composition according to claim 12, wherein said crosslinking agent is a silane compound represented by the following formula (1):

wherein X is an organic group having an epoxy group at the terminal,
$R^1$ and $R^2$ are, respectively, methyl groups, ethyl groups or isopropyl groups, and
n is 0, 1 or 2.

15. The coating composition according to claim 11, wherein said ionic polymer (a) is an anionic polymer (a2) and, further, contains a closely adhering agent (c).

16. The coating composition according to claim 15, wherein said hygroscopic agent (b) is contained in an amount of 50 to 1300 parts by weight, said crosslinking agent is contained in an amount of 1 to 50 parts by weight, and said closely adhering agent (c) is contained in an amount of 0.1 to 10 parts by weight per 100 parts by weight of said anionic polymer (a2).

17. The coating composition according to claim 15, wherein said crosslinking agent is a diglycidyl ester represented by the following formula (2),

wherein G is a glycidyl group, and
A is a divalent hydrocarbon group having an aliphatic ring.

18. The coating composition according to claim 15, wherein said closely adhering agent (c) is a silane compound represented by the following formula (1):

  (1)

wherein X is an organic group having an epoxy group at the terminal,
$R^1$ and $R^2$ are, respectively, methyl groups, ethyl groups or isopropyl groups, and
n is 0, 1 or 2.

* * * * *